(12) United States Patent
Ryu

(10) Patent No.: US 12,010,474 B2
(45) Date of Patent: Jun. 11, 2024

(54) WIRELESS EARBUD

(71) Applicant: LG ELECTRONICS INC., Seoul (KR)

(72) Inventor: Seungwoo Ryu, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 174 days.

(21) Appl. No.: 17/846,975

(22) Filed: Jun. 22, 2022

(65) Prior Publication Data

US 2023/0300506 A1    Sep. 21, 2023

(30) Foreign Application Priority Data

Mar. 21, 2022   (KR) .......................... 10-2022-0034905

(51) Int. Cl.
  *H04R 1/10*   (2006.01)
  *H04R 1/28*   (2006.01)
  *H05K 1/18*   (2006.01)

(52) U.S. Cl.
  CPC ......... *H04R 1/1016* (2013.01); *H04R 1/1025* (2013.01); *H04R 1/2846* (2013.01); *H05K 1/189* (2013.01); *H04R 1/1041* (2013.01); *H04R 2420/07* (2013.01)

(58) Field of Classification Search
  CPC .. H04R 1/1016; H04R 1/1025; H04R 1/2846; H04R 1/1041; H04R 2420/07; H01Q 1/243; H01Q 21/28; H05K 1/189
  USPC ........................ 381/380; 361/748; 455/575.7
  See application file for complete search history.

(56) References Cited

U.S. PATENT DOCUMENTS

2020/0243949 A1*   7/2020   Kim ..................... H04M 1/026
2022/0337933 A1*  10/2022   Yang .................... H01Q 1/38

* cited by examiner

*Primary Examiner* — Norman Yu
(74) *Attorney, Agent, or Firm* — LEE, HONG, DEGERMAN, KANG & WAIMEY

(57) ABSTRACT

An earbud includes a housing having a main body portion having a speaker port and a stoke extending from the main body portion; a radiator disposed in the stoke to radiate radio signals to the outside of the earbud; and a printed circuit board (PCB) configured to be electrically connected to the radiator. The radiator includes a first conductive pattern formed on a first surface in the stoke; a second conductive pattern formed on a second surface perpendicular to the first surface; and a connection portion configured to electrically connect the first conductive pattern and the PCB. The first conductive pattern and the connection portion may be configured to radiate signals in a first frequency band, and the first conductive pattern and the second conductive pattern may be configured to radiate signals in a second frequency band different from the first frequency band.

20 Claims, 30 Drawing Sheets

FIG. 5B
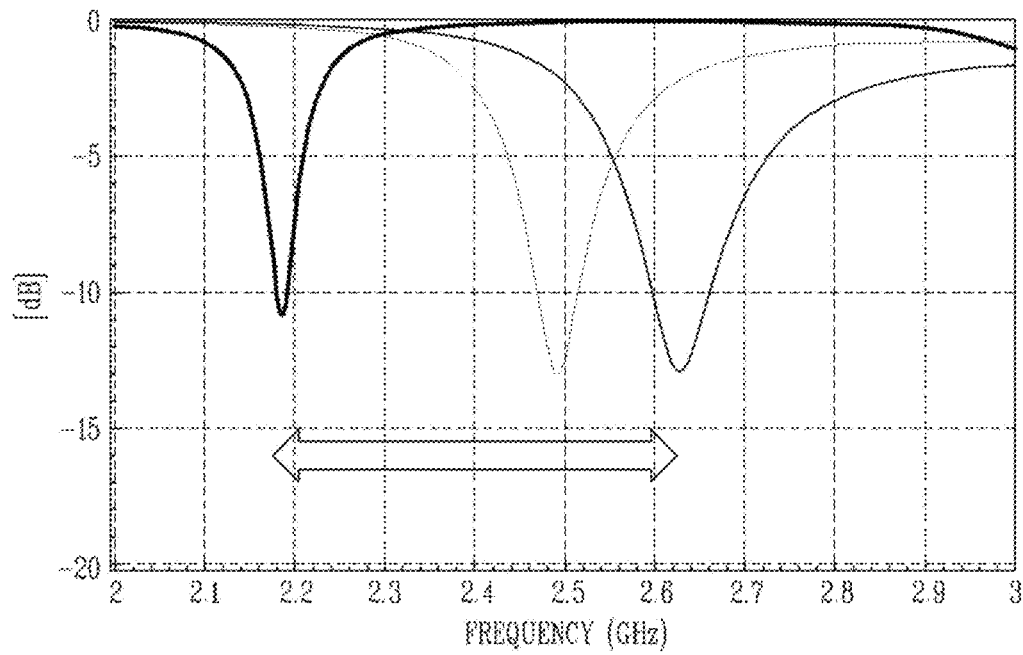
(a)
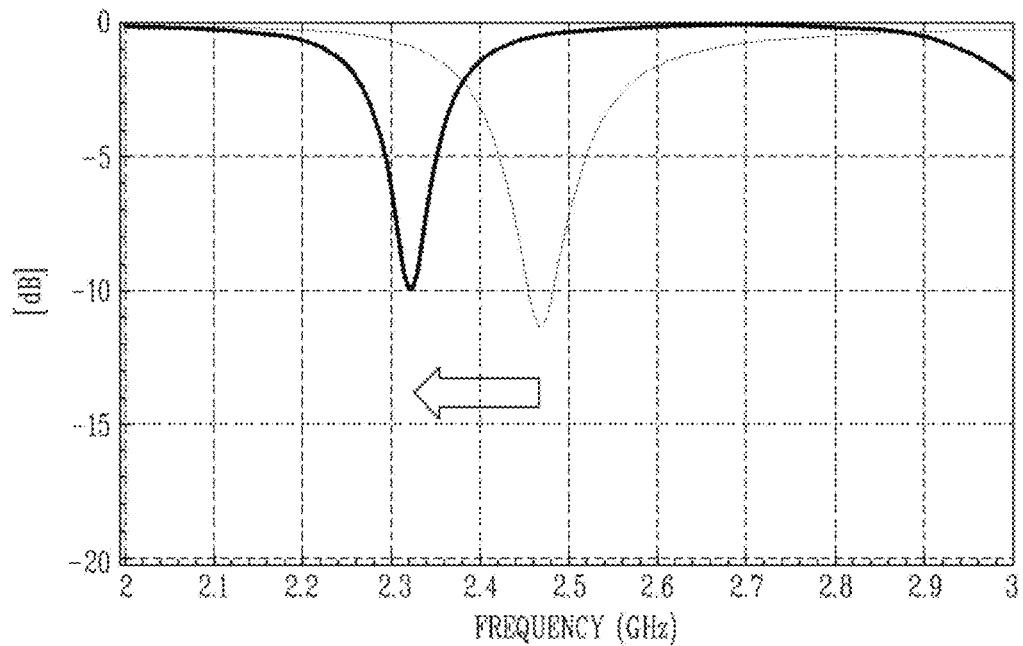
(b)

FIG. 5C
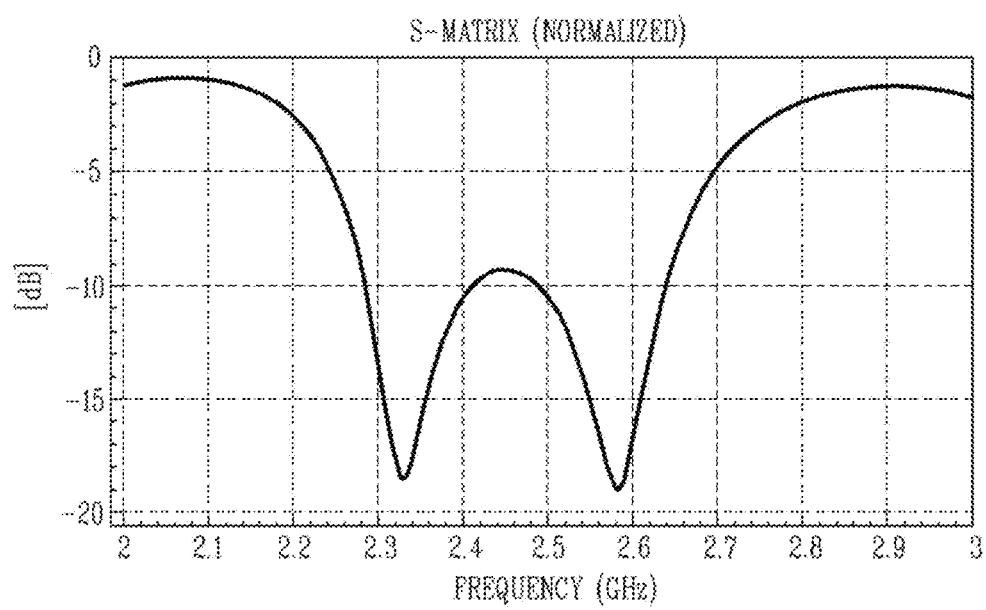
(a)
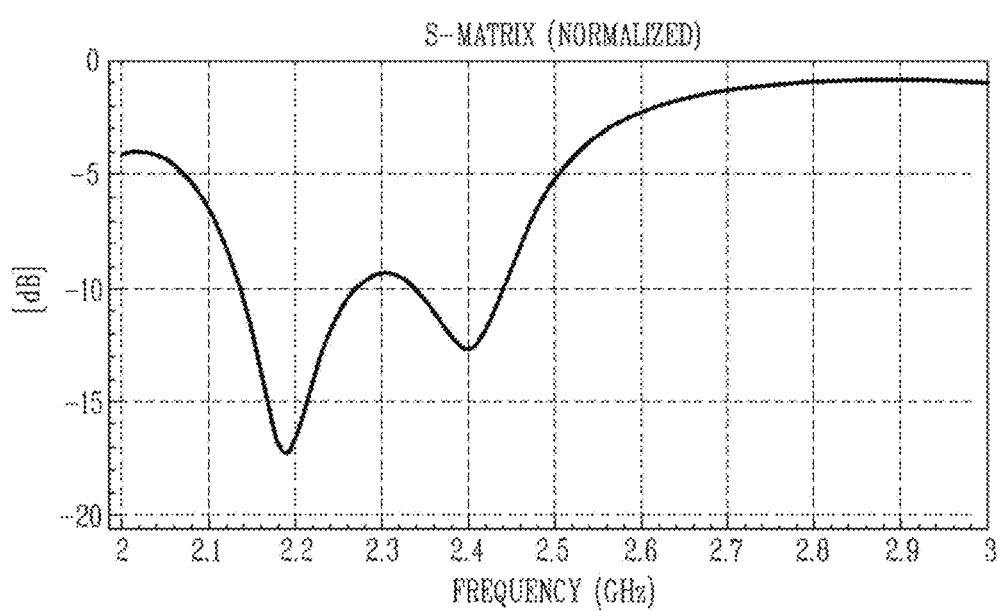
(b)

FIG. 6A
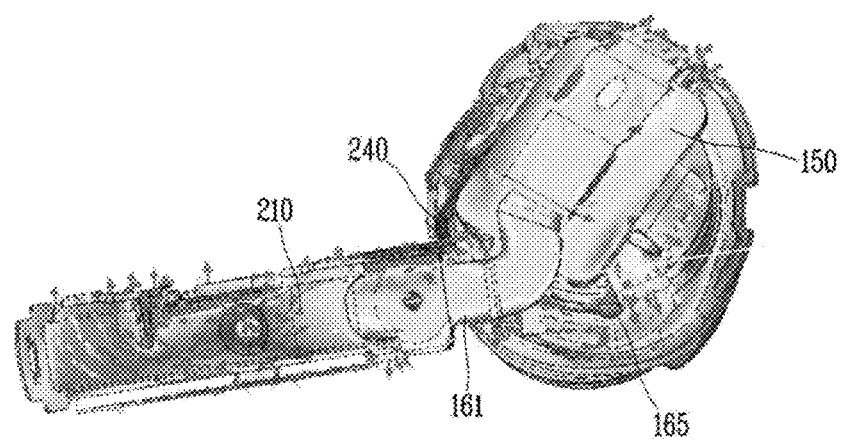
(a)
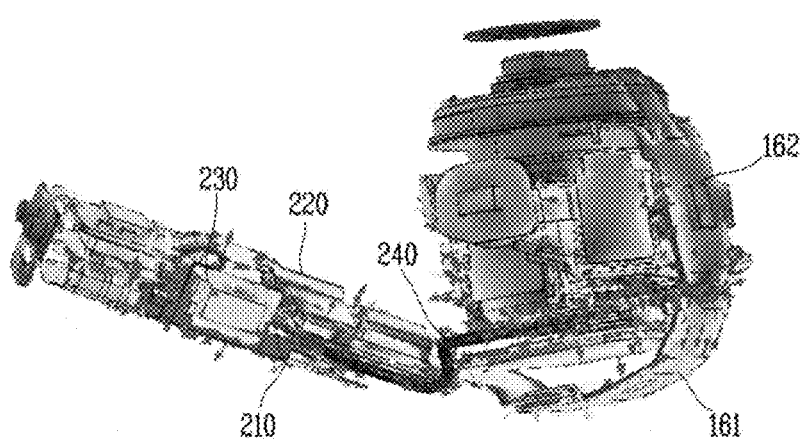
(b)

FIG. 6B
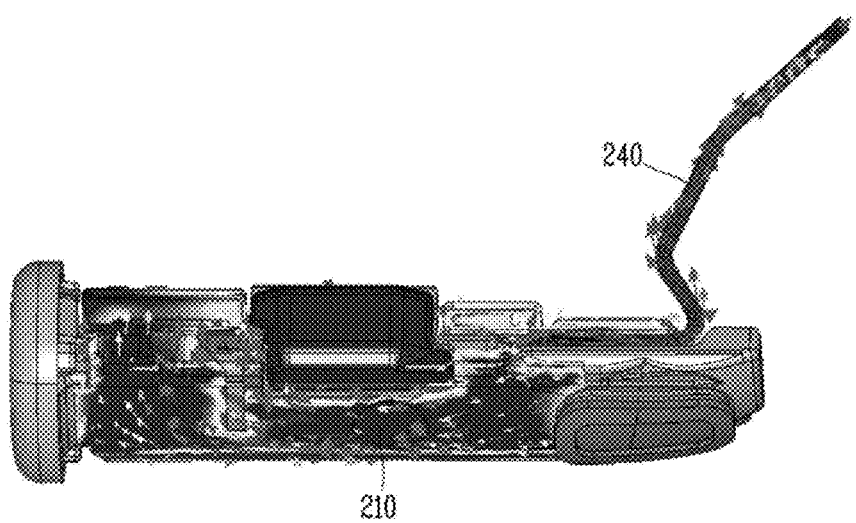
(a)
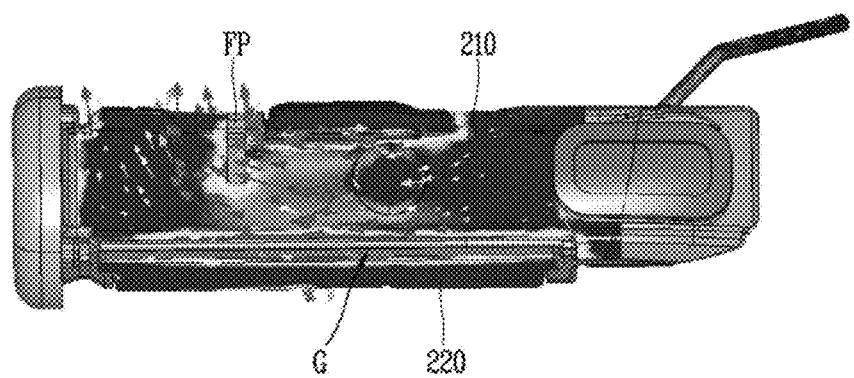
(b)

(a)    (b)

(a)  (b)

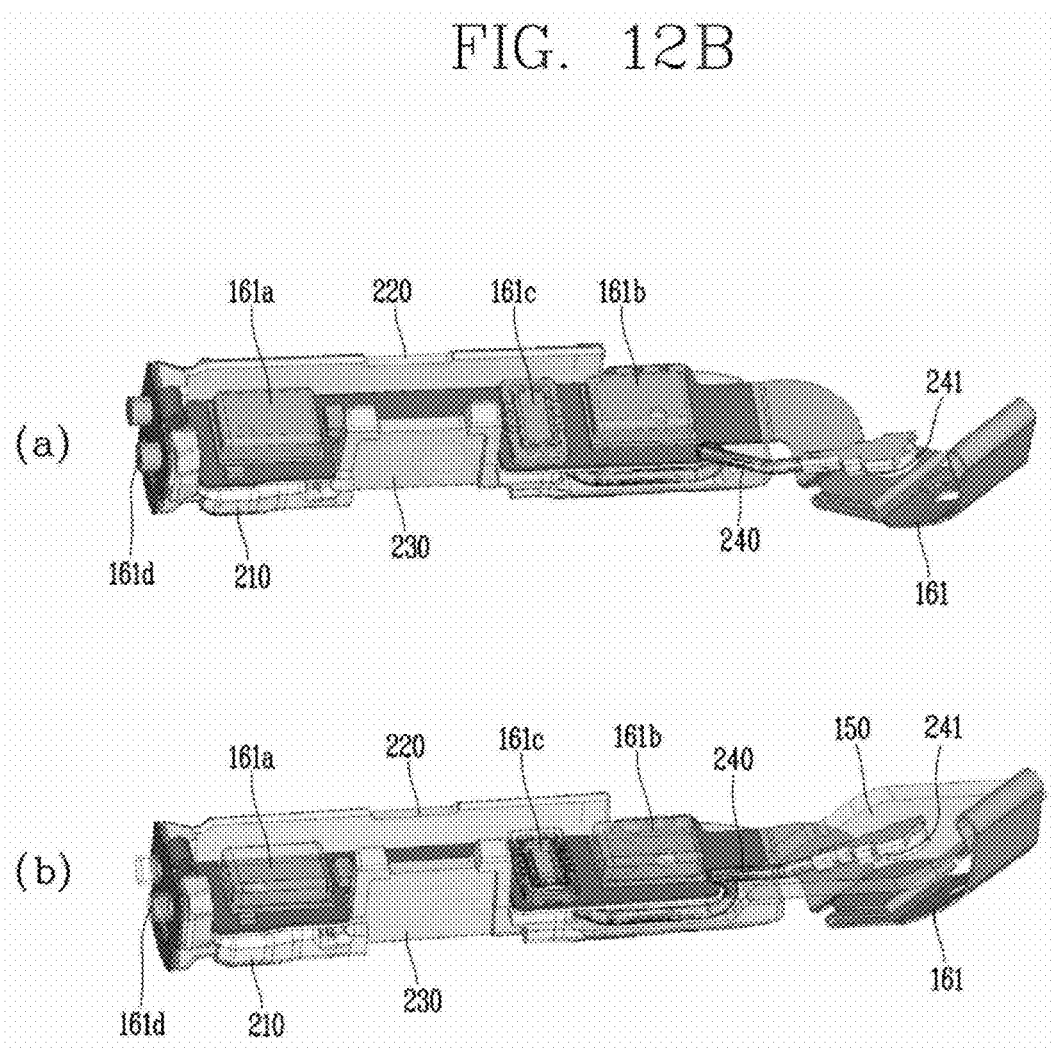

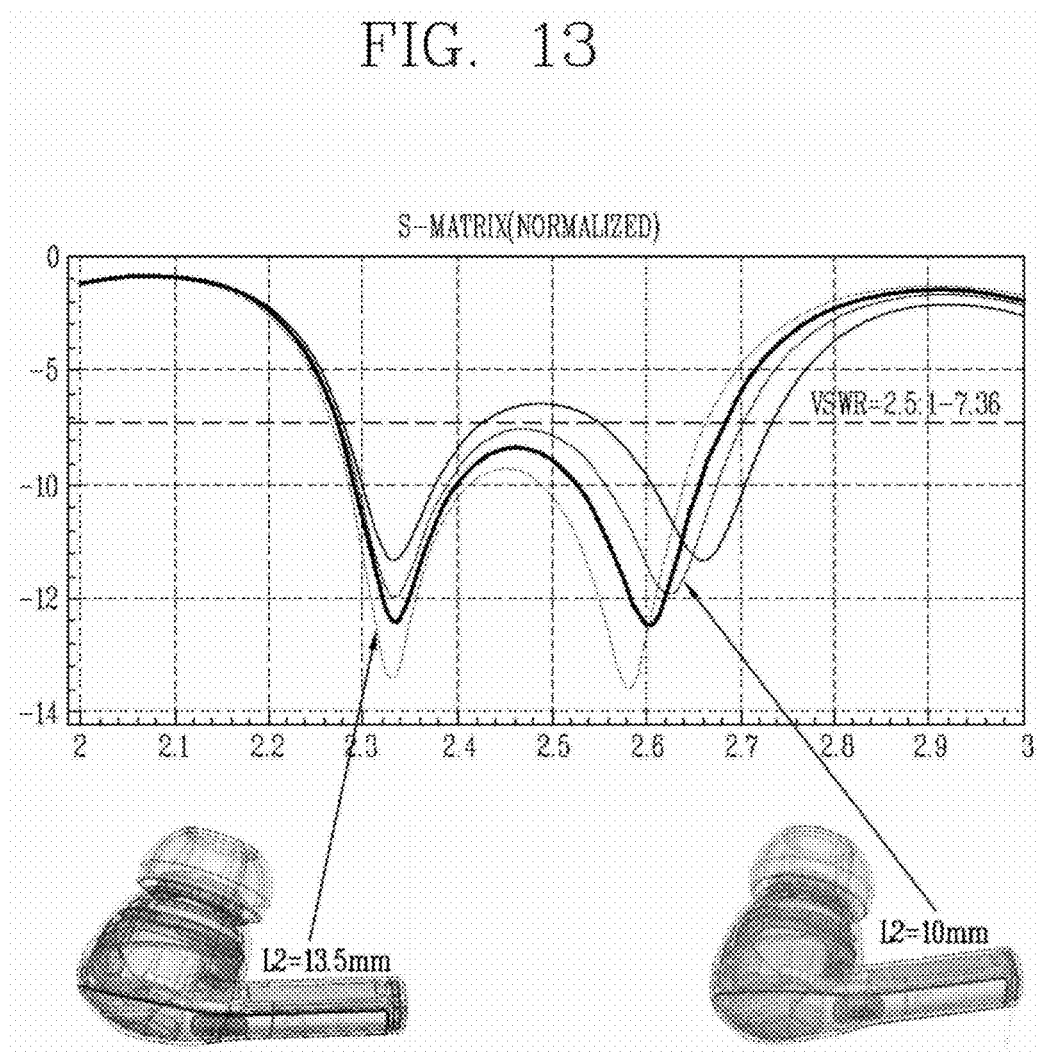

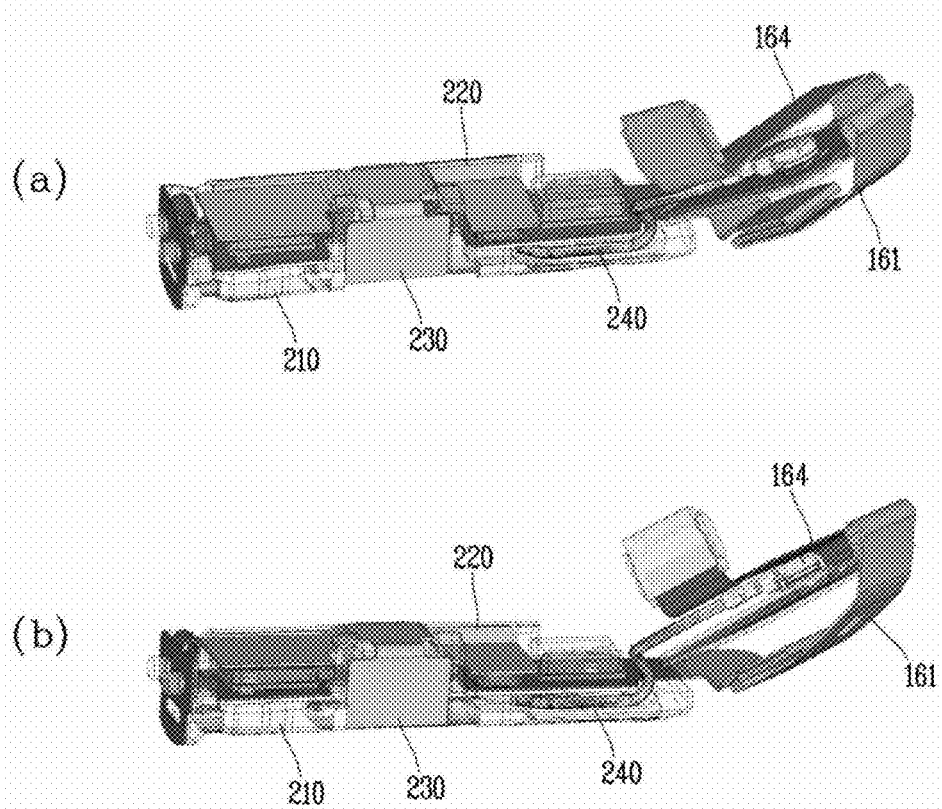

FIG. 14C
(a)
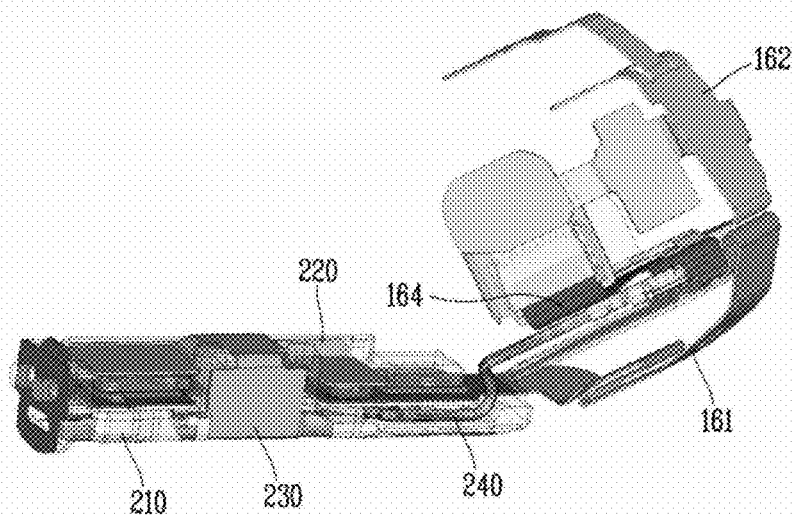
(b)
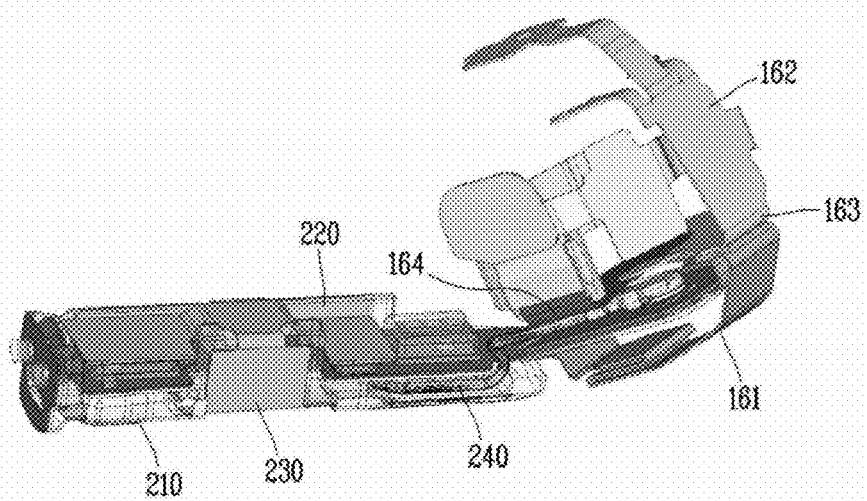

FIG. 16A
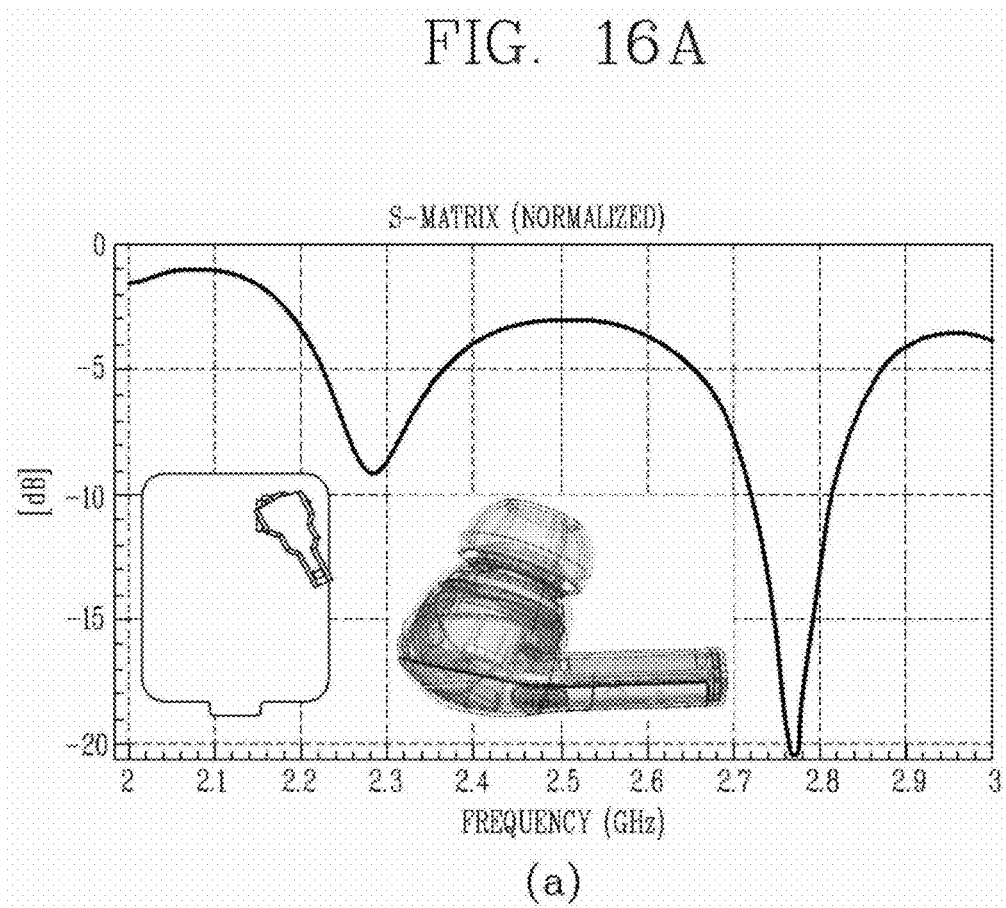
(a)
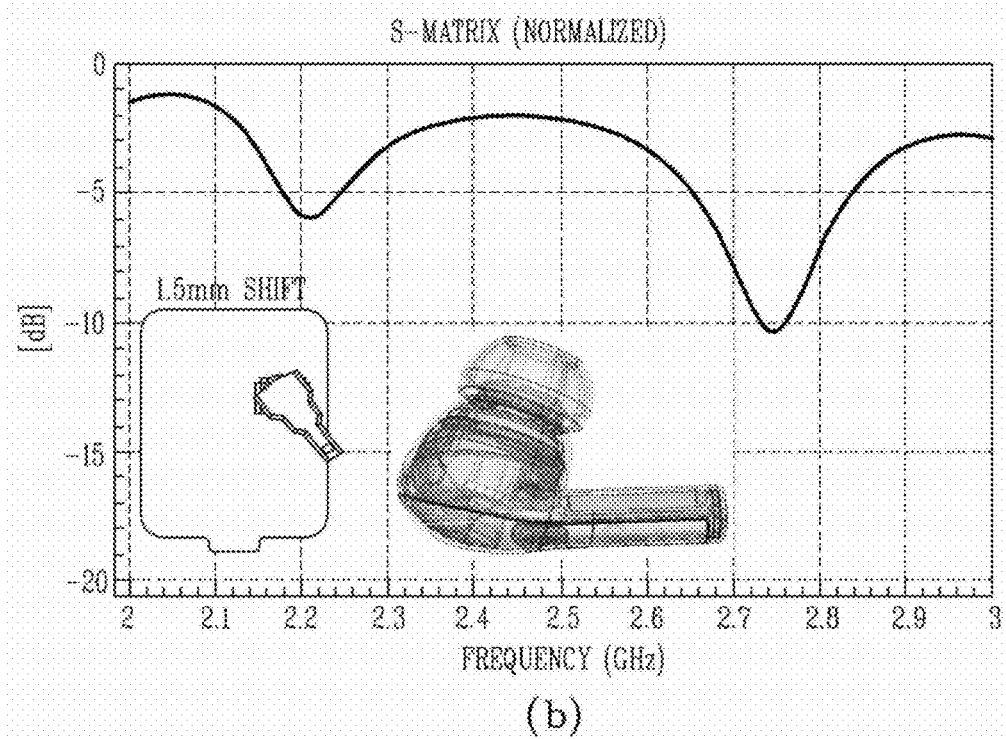
(b)

FIG. 17A
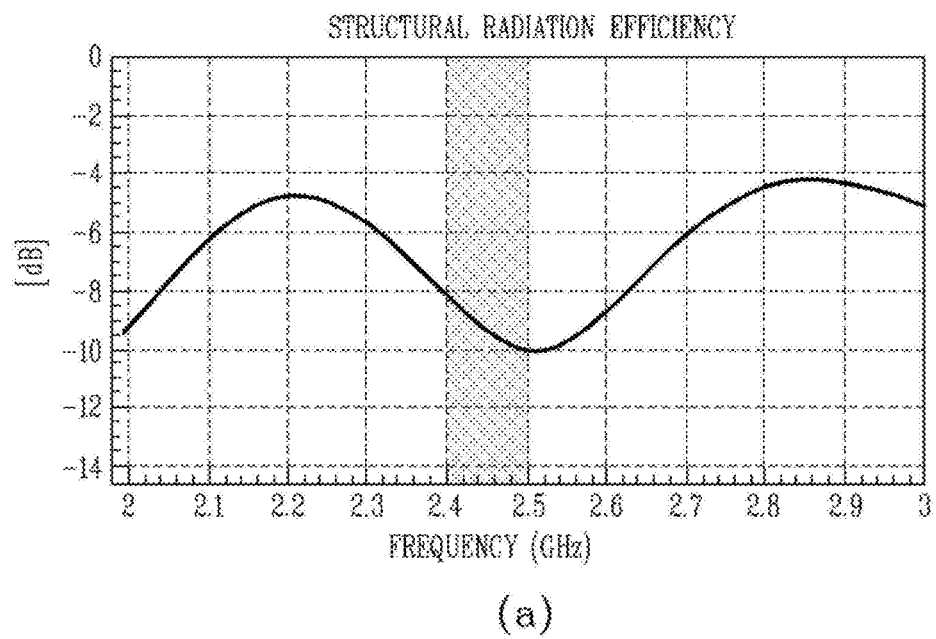
(a)
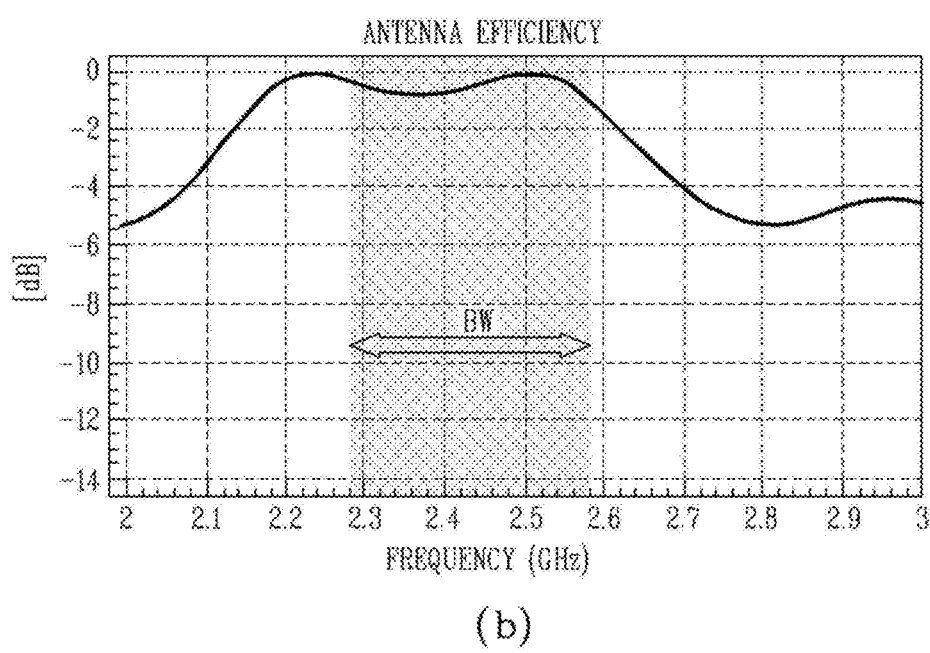
(b)

WIRELESS EARBUD

CROSS-REFERENCE TO RELATED APPLICATION

Pursuant to 35 U.S.C. § 119(a), this application claims the benefit of earlier filing date and right of priority to Korean Patent Application No. 10-2022-0034905, filed on Mar. 21, 2022, the contents of which are incorporated by reference herein in its entirety.

TECHNICAL FIELD

The present disclosure relates to an electronic device, and more particularly, to an electronic device with an antenna. A specific implementation relates to a wireless earbud with an antenna and a control circuit.

BACKGROUND

Electronic devices such as electronic accessories for cell phones, computers, and other electronic equipment may include a wireless circuit. For example, earbuds may be used as electronic devices that communicate wirelessly with cell phones and other equipment.

Small electronic devices such as a wireless earbud may be configured to receive reproduced content from a mobile terminal, which is a host device, through a Bluetooth frequency band. Wireless earbuds correspond to wearable electronic devices that are inserted into human ears.

Another problem may arise in implementing an antenna and a wireless communication circuit in a small electronic device such as a wireless earbud. In this regard, an antenna may not operate effectively in the main body of a wireless earbud worn on a human body to radiate radio signals. Accordingly, there is a problem in that it is difficult to achieve desired wireless communication performance through wireless communication with a peripheral electronic device.

Wireless earbuds may be designed to receive radio signals through a Bluetooth frequency band having a predetermined bandwidth with a center frequency of about 2.45 GHz. In this regard, the operational bandwidth of an antenna provided in a wireless earbud needs to be designed to be wider than those of other electronic devices that perform wireless communication through Bluetooth frequency bands. This is because an antenna resonance frequency may be changed according to the movement of a human body when a wireless earbud is worn or according to the movement of a wireless earbud in the inner ear space. Also, a change in antenna performance occurring due to a production deviation may be sensitive because an antenna arrangement space inside the mechanism of a wireless earbud is narrow.

Accordingly, there is a need to implement an electronic device such as a wireless earbud with an improved antenna and control circuit.

SUMMARY

The present disclosure aims to solve the above and other problems. Also, another object is to provide an electronic device such as a wireless earbud with an improved antenna and control circuit.

Another object of the present disclosure is to increase the operational bandwidth of an antenna provided in a wireless earbud.

Another object of the present disclosure is to stably receive radio signals even when an antenna resonance frequency is changed as a wireless earbud is worn.

Another object of the present disclosure is to minimize a change in antenna performance due to a narrow antenna arrangement space inside the mechanism of a wireless earbud.

According to embodiments for achieving the above and other objects, an earbud includes a housing having a main body portion having a speaker port and a stoke extending from the main body portion, a radiator disposed in the stoke and configured to radiate radio signals to the outside of the earbud, and a printed circuit board (PCB) configured to be electrically connected to the radiator. The radiator includes a first conductive pattern formed on a first surface in the stoke, a second conductive pattern formed on a second surface perpendicular to the first surface, and a connection portion configured to electrically connect the first conductive pattern and the PCB. The first conductive pattern and the connection portion may be configured to radiate signals in a first frequency band, and the first conductive pattern and the second conductive pattern may be configured to radiate signals in a second frequency band different from the first frequency band.

According to an embodiment, the connection portion may be configured as a coaxial cable including a signal line formed inside, a dielectric formed to surround the signal line, and a ground formed outside to surround the dielectric. The signal line of the coaxial cable may be connected to the first conductive pattern, the ground of the coaxial cable may be connected to a ground of the PCB, and the first conductive pattern and the ground of the coaxial cable connected to the first conductive pattern may radiate first signals in the first frequency band to operate as the radiator.

According to an embodiment, the second conductive pattern may include a touch sensor. The first conductive pattern may be formed to a first length in a first axial direction of the stoke, and the second conductive pattern may be formed to a second length in the first axial direction.

According to an embodiment, the first length of the first conductive pattern may be formed to a length in a predetermined range from 14.6 mm, and the second length of the second conductive pattern may be formed to a length in a predetermined range from 13.6 mm. The first frequency band may be a frequency band with a center frequency of 2.3 GHz to perform Bluetooth communication with an electronic device, and the first frequency band may be a frequency band with a center frequency of 2.6 GHz to perform the Bluetooth communication.

According to an embodiment, the first conductive pattern formed on the first surface and the coaxial cable formed on the first surface may radiate a first signal in the first frequency band. The first conductive pattern and the second conductive pattern formed on the second surface perpendicular to the first surface may be configured to radiate a second signal in the second frequency band. A first direction of a first electric current formed in the coaxial cable and the first conductive pattern of the first surface and a second direction of a second electric current formed in the second conductive pattern of the second surface perpendicular to the first surface may be formed to be orthogonal so that the radiator performs broadband operation in the first frequency band and the second frequency band.

According to an embodiment, one end portion of the first conductive pattern and one end portion of the second conductive pattern may be formed separately from each other, and an electric current formed in the first conductive pattern may be coupled to the second conductive pattern in the second frequency band.

According to an embodiment, the radiator may further include a third conductive pattern formed on a third surface facing the second conductive pattern. The third conductive pattern disposed on the third surface may include a force sensor.

According to an embodiment, the third conductive pattern may be configured to radiate signals in a third frequency band higher than the second frequency band. The third frequency band may be a 5 GHz band or a 7 GHz band for Bluetooth communication.

According to an embodiment, a signal pattern of the first conductive pattern may be formed as a conductive pattern of a predetermined shape to radiate signals in the first frequency band and the second frequency band. A ground pattern of the first conductive pattern may be electrically connected to the ground of the coaxial cable.

According to an embodiment, a signal pattern of the second conductive pattern may be formed as a conductive pattern of a predetermined shape to radiate signals in the second frequency band and operate as a touch sensor. A ground pattern of the second conductive pattern may be electrically connected to the ground of the coaxial cable.

According to an embodiment, a signal pattern of the third conductive pattern may be formed as a conductive pattern of a predetermined shape to operate as a force sensor. A ground pattern of the third conductive pattern may be electrically connected to the ground of the coaxial cable.

According to an embodiment, the earbud may further include a flexible printed circuit board (FPCB) configured to connect the PCB and the first conductive pattern. The FPCB may be formed to surround a metal frame forming an inner side area formed as a curved surface of the main body portion.

The earbud may further include a second FPCB connected to one end of the FPCB and disposed in the inner side area and a metal gasket configured such that a ground pattern of the FPCB and a ground pattern of the second FPCB are connected to the metal frame.

According to an embodiment, the main body portion may further include a proximity sensor and a voice pickup unit (VPU) disposed in a first side area of an outer side and a connector and a battery protection circuit disposed between an inner side and a second side area of the outer side. The FPCB disposed between the main body portion and the metal frame disposed in the inner side area of the main body portion may be electrically connected to the proximity sensor, the VPU, the connector, and the battery protection circuit.

According to an embodiment, the first conductive pattern may be selectively formed on a dielectric molded portion using a laser, and the second conductive pattern may be formed over the first conductive pattern by plating.

According to another aspect of the present disclosure, an electronic device may include a dielectric housing having a main body portion having a port and a protruding portion extending from the main body portion and an antenna disposed in the protruding portion and configured to radiate radio signals to the outside of the electronic device. The antenna may include a first conductive pattern formed on a first surface in the protruding portion, a second conductive pattern formed on a second surface perpendicular to the first surface, and a connection portion configured to electrically connect the first conductive pattern and a printed circuit board (PCB). The first conductive pattern and the connection portion may be configured to radiate signals in a first frequency band, and the first conductive pattern and the second conductive pattern may be configured to radiate signals in a second frequency band different from the first frequency band.

According to an embodiment, the electronic device may further include the PCB, which is electrically connected to the antenna. The connection portion may be configured as a coaxial cable including a signal line formed inside, a dielectric formed to surround the signal line, and a ground formed outside to surround the dielectric. The signal line of the coaxial cable may be connected to the first conductive pattern, and the ground of the coaxial cable may be connected to a ground of the PCB. The first conductive pattern and the ground of the coaxial cable connected to the first conductive pattern may radiate a first signal in the first frequency band to operate as a radiator.

According to an embodiment, the second conductive pattern may include a touch sensor. The first conductive pattern may be formed to a first length in a first axial direction of a stoke, and the second conductive pattern may be formed to a second length in the first axial direction.

According to an embodiment, the first length of the first conductive pattern may be formed to a length in a predetermined range from 14.6 mm, and the second length of the second conductive pattern may be formed to a length in a predetermined range from 13.6 mm. The first frequency band may be a frequency band with a center frequency of 2.3 GHz to perform Bluetooth communication with an electronic device, and the first frequency band may be a frequency band with a center frequency of 2.6 GHz to perform the Bluetooth communication.

According to an embodiment, the first conductive pattern formed on the first surface and the coaxial cable formed on the first surface may radiate a first signal in the first frequency band. The first conductive pattern and the second conductive pattern formed on the second surface perpendicular to the first surface may be configured to radiate a second signal in the second frequency band.

The technical effects of the wireless earbuds having the broadband antenna will be described as follows.

According to the present disclosure, it is possible to allow a broadband antenna in an electronic device such as a wireless earbud to perform broadband operation.

According to the present disclosure, by allowing electric current formed in a conductive pattern of an antenna provided in a wireless earbud to be coupled to a touch sensor, it is possible to increase the operational bandwidth of the antenna.

According to the present disclosure, it is possible to receive radio signals stably even when an antenna resonance frequency is changed according to the movement of a wireless earbud in an internal ear space or the movement of a human body when the wireless earbud is worn.

According to the present disclosure, it is possible to minimize a change in antenna performance due to a narrow antenna arrangement space inside the mechanism of a wireless earbud, and thus it is possible to stably maintain wireless communication performance.

Further scope of applicability of the present disclosure will become apparent from the following detailed description. It should be understood, however, that the detailed description and specific examples, such as the preferred embodiment of the invention, are given by way of illustration only, since various changes and modifications within the spirit and scope of the invention will be apparent to those skilled in the art.

BRIEF DESCRIPTION OF THE DRAWINGS

FIGS. 5B and 5C show reflection coefficient changes due to the deformation of radio frequency (RF) cables and flexible printed circuit boards (FPCBs) in single-mode and dual-mode antenna structures.

FIG. 6A shows a current distribution formed in conductive patterns, a metal frame, an FPCB, and an RF cable disposed inside the earbud according to the present disclosure. Meanwhile, FIG. 6B shows a current distribution formed in conductive patterns and an RF cable disposed inside the earbud of FIG. 6A.

FIGS. 12A to 12C illustrate a structure in which a conductive pattern and electronic components inside the earbud according to the present disclosure are arranged when the structure is viewed from different perspectives.

FIG. 13 illustrates antenna reflection coefficient characteristics according to a change in the length of a touch sensor in an antenna structure inside the earbud.

FIGS. 14A to 14C show a structure in which a plurality of FPCBs are disposed and assembled inside the earbud according to the present disclosure.

FIG. 16A illustrates reflection coefficient characteristics according to the change of an RF cable connection point when a slide touch sensor corresponding to no coupling conductive pattern is disposed inside the earbud.

FIG. 17A shows structural radiation performance and antenna performance caused by a mechanism structure in a broadband antenna structure disposed inside the earbud according to the present disclosure.

DETAILED DESCRIPTION

Figure 1:
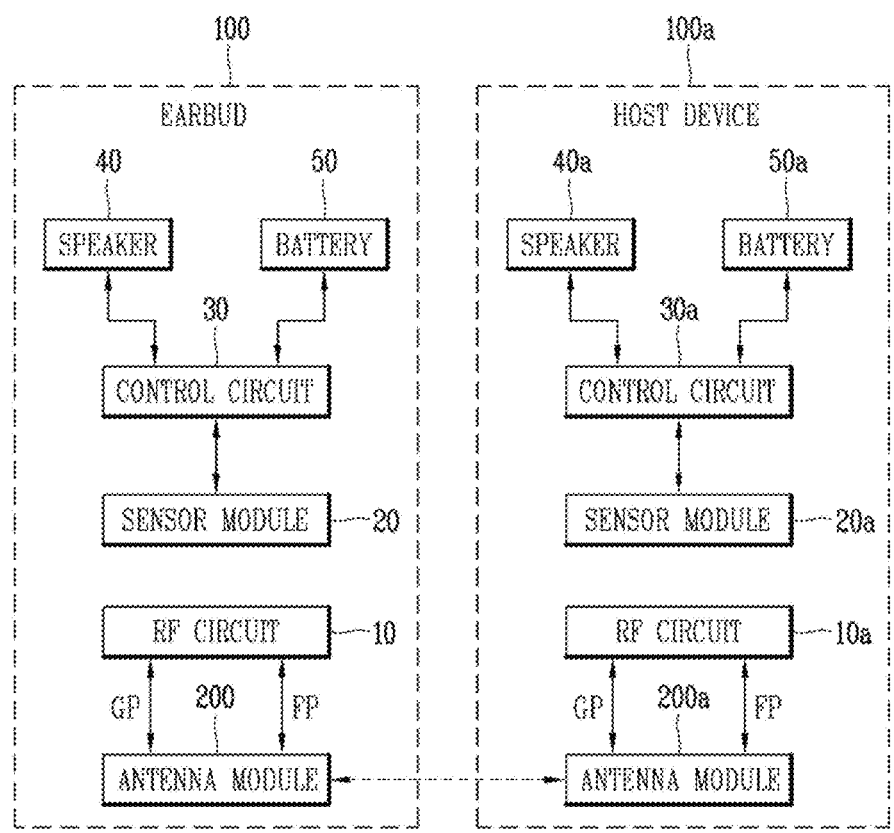
FIG. 1 is a block diagram of an exemplary system including an electronic device that wirelessly communicates with a wearable electronic device such as a wireless earbud according to the present disclosure.

Description will now be given in detail according to exemplary embodiments disclosed herein, with reference to the accompanying drawings. For the sake of brief description with reference to the drawings, the same or equivalent components may be provided with the same or similar reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In describing the present disclosure, if a detailed explanation for a related known function or construction is considered to unnecessarily divert the gist of the present disclosure, such explanation has been omitted but would be understood by those skilled in the art. The accompanying drawings are used to help easily understand the technical idea of the present disclosure and it should be understood that the idea of the present disclosure is not limited by the accompanying drawings. The idea of the present disclosure should be construed to extend to any alterations, equivalents and substitutes besides the accompanying drawings.

It will be understood that although the terms first, second, etc. may be used herein to describe various elements, these elements should not be limited by these terms. These terms are generally only used to distinguish one element from another.

It will be understood that when an element is referred to as being "connected with" another element, the element can be connected with the another element or intervening elements may also be present. In contrast, when an element is referred to as being "directly connected with" another element, there are no intervening elements present.

A singular representation may include a plural representation unless it represents a definitely different meaning from the context.

Terms such as "include" or "has" are used herein and should be understood that they are intended to indicate an existence of several components, functions or steps, disclosed in the specification, and it is also understood that greater or fewer components, functions, or steps may likewise be utilized.

An electronic device described herein may be a wearable device. Wireless wearable electronic devices such as a wireless earbud may communicate with a host device and with each other. Any suitable type of host electronic devices and wearable wireless electronic devices may be used in this type of arrangement. The use of a wireless host such as a cellular phone, computer, or wristwatch may sometimes be described herein as an example. Also, any suitable wearable wireless electronic device may wirelessly communicate with a wireless host. The use of wireless earbuds to communicate with a wireless host is just exemplary.

A wireless electronic device host may wirelessly communicate with an accessory device such as earbuds. In this regard, FIG. 1 is a block diagram of an exemplary system including an electronic device that wirelessly communicates with a wearable electronic device such as a wireless earbud according to the present disclosure.

Referring to FIG. 1, a host electronic device 100a may be a mobile terminal capable of performing wireless communication or a wearable device other than a wireless earbud, but the present disclosure is not limited thereto. The host electronic device 100a may be implemented as any electronic device capable of performing wireless communication with a wireless earbud, for example, one of a computer, a laptop computer, a content playback device of a home network, or a communication device of a vehicle.

A wireless earbud 100 may be configured to include various components. In this regard, the wireless earbud 100 may be configured to include an antenna module 200, a radio frequency (RF) circuit 10, and a sensor module 20. The wireless earbud 100 may be configured to further include a control circuit 30, a speaker 40 and a battery 50. Meanwhile, the host electronic device 100a may be configured to include an antenna module 200a and an RF circuit 10a to perform wireless communication with the earbud 100. The host electronic device 100a may be configured to further include a sensor module 20, a control circuit 30, a speaker 40 and a battery 50, but the present disclosure is not limited thereto. The host electronic device 100a may be configured to further include more components than the earbud 100.

The antenna module 200 may be configured to receive radio signals including voice content from the host electronic device 100a. The antenna module 200 may be configured to receive radio signals in the Bluetooth band, for example, in 2.4 to 2.488 GHz band from the host electronic device 100a. In this regard, a wireless communication link between the host electronic device 100a and the earbud 100 is not limited to Bluetooth communication. Any wireless communication link capable of supporting short-range wireless communication between the host electronic device 100a and the earbud 100, for example, a short-range wireless communication link in 2.4 GHz, 5 GHz, or other frequency bands may be used. Depending on the application, a wireless communication link in a mobile communication frequency band that supports Internet of Things (IoT) wireless communication or a wireless communication link in a millimeter-wave band may be used.

Also, when a user input is applied by a manipulation button provided in the earbud 100, a control command may be transmitted to the host electronic device 100a through the antenna module 200 to control the playback and volume of voice content. The antenna module 200a of the host electronic device 100a may receive radio signals including the control command in the Bluetooth band.

The antenna module 200 may be operably combined with the RF circuit 10. The antenna module 200 may be connected to a power feeding unit FP and a signal pattern of the RF circuit 10. The antenna module 200 may be connected to a ground connection portion GP and a ground pattern of the RF circuit 10. The RF circuit 10 may be configured to amplify, filter, and process signals transmitted through the antenna module 200 and signals received through the antenna module 200.

The sensor module 20 may be configured to include at least one sensor. The sensor module 20 may be configured to include a proximity sensor capable of detecting a user's movement and approach, a touch sensor and pressure sensor capable of detecting a user input, etc, but the present disclosure is not limited thereto. The sensor module 20 may further include an acceleration sensor, a gyro sensor, etc.

The control circuit 30 may be operably combined with the sensor module 20, the speaker 40, and the battery 50. The control circuit 30 may be configured to control the operations of the sensor module 20, the speaker 40, and the battery 50.

The battery 50 may be configured to supply power to various electronic components disposed inside the earbud 100. The battery 50 may be configured to store power when the power is received from a charger and supply the power to various kinds of electronic components. The speaker 40 may be configured to play back voice content received from the host electronic device 100a.

Meanwhile, the earbud 100 according to the present disclosure may be formed in a mechanism structure having the shape of a housing, and a port such as a speaker port may be formed on the housing. In this regard, an antenna module capable of receiving or transmitting radio signals may be disposed inside the housing of the earbud 100. In this regard, FIGS. 2 and 3 are a front perspective view and a rear perspective view of an earbud according to the present disclosure.

Figure 2:
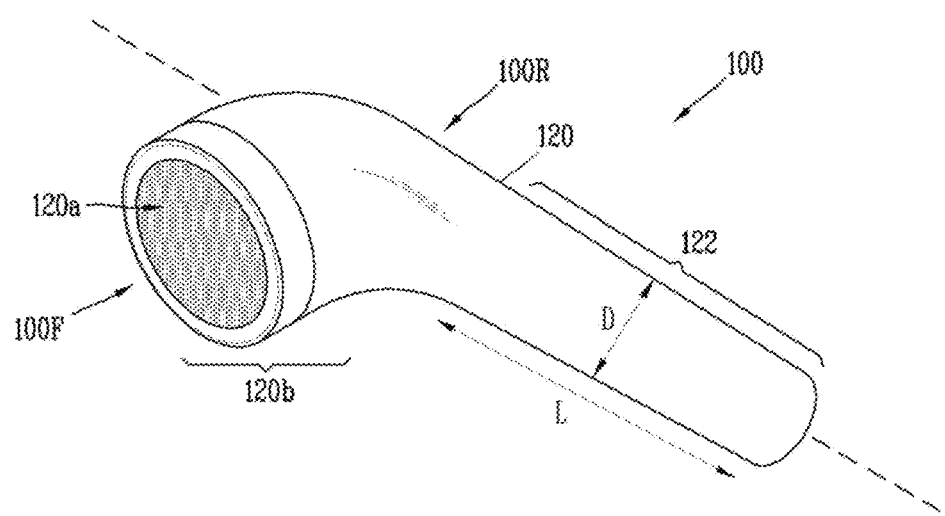
FIGS. 2 and 3 are a front perspective view and a rear perspective view of an earbud according to the present disclosure.
Figure 3:
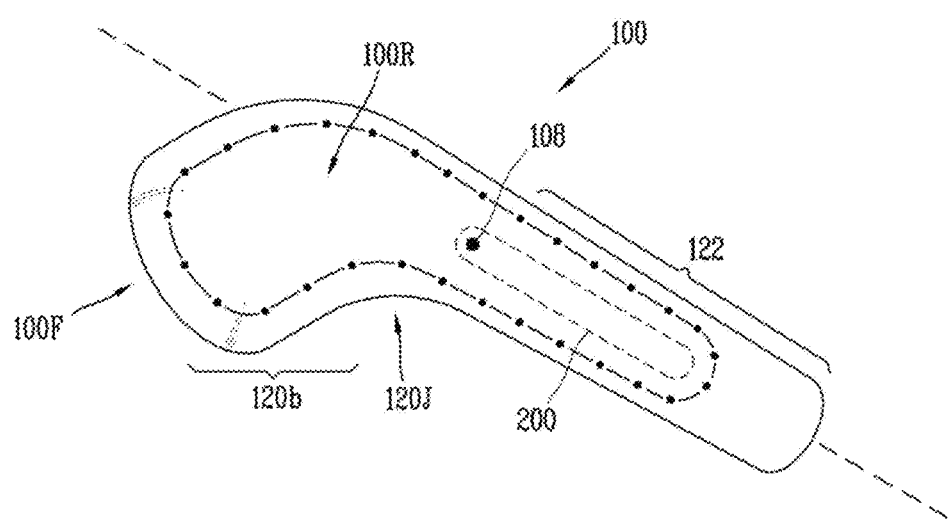

Referring to the front perspective view of FIG. 2, the earbud 100 may be divided into a front surface 100F and a rear surface 100R with respect to one axis. The housing 120 may include a main body portion 120b where a speaker port 120a is formed. The speaker port 120a may be formed toward the front surface of the earbud 100. An elongated protruding portion such as a stoke portion 122 of the housing 120 may be extended externally from the main body portion 120b. The stoke portion 122 may be formed as an elongated protruding portion with a predetermined length L and a predetermined diameter D.

The main body portion 120b may have a shape that fits a user's ear. The speaker 40 may be mounted on the main body portion 120b and be aligned with the speaker port 120a. The speaker 40 may be used to provide sound to the user's ear. The speaker port 120a may be formed from one or more openings of the housing 120. One or more plastic or metallic mesh layers may be interposed between an opening(s) of the housing 120 and the speaker 40.

The housing 120 may be formed of metal, plastic, carbon fiber composite material or other fiber composite material, glass, ceramic, other material, or a combination of these materials. The elongated shape of a stoke 122 allows the user to grip the earbud 100 at the ear by hand. The stoke 122 may extend from the main body portion 120b in the rear surface 100R of the housing 120 and may be extended along a lengthwise stoke axis 120. Depending on the application, the stoke 122 may be formed in a certain form of curved shape other than a straight line shape.

FIG. 3 shows a rear perspective view of the earbud 100 of FIG. 2. As shown in FIG. 3, the antenna 200 may have an elongated shape that is extended along an axis parallel to the length of the stoke 122. The antenna 200 may be formed from the power feeding portion 108 to a lower area of the stoke 122, but the present disclosure is not limited thereto.

Referring to FIGS. 1 to 3, the antenna 200 may be overlapped with a structure such as a battery 26 and other conductive components located in an inner area of the housing 120. The structure may include a conductive material that tends to shield the antenna 200.

The antenna power feeding portion 108 may be located not in a joint portion 120J of the housing 120 between the main body portion 120b and the stoke 122 but in a location overlapped with the area of the main body portion 120b. Placing the antenna power feeding portion at a second position 108 such as a joint point 120J rather than a first position such as the main body portion 120b may help minimize unwanted radiation and current consumption occurring on other ground planes. By minimizing the unwanted radiation and current consumption, it is possible to reduce battery current consumption and improve antenna efficiency.

The antenna 200 may be formed as a metal trace or a metal pattern formed through patterning on a printed circuit board (PCB). A PCB may be formed as a flexible printed circuit board (FPCB) (e.g., a printed circuit formed as a sheet made of polyimide or other polymer substrate material) in addition to a rigid substrate.

A configuration for performing wireless communication with an electronic device outside the earbud according to the present disclosure through a radiator disposed inside the earbud will be described below. The electronic device outside the earbud may correspond to the host electronic device 100a of FIG. 1, and the earbud may correspond to the earbud 100 of FIG. 1 and perform wireless communication with the host electronic device 100a through the antenna module 200. The earbud may correspond to a kind of electronic device for receiving content through wireless communication with the host electronic device. The earbud may be referred to as a true wireless stereo (TWS). A radiator structure disposed inside the earbud for performing wireless communication with the host electronic device will be described in detail.

Figure 4A:
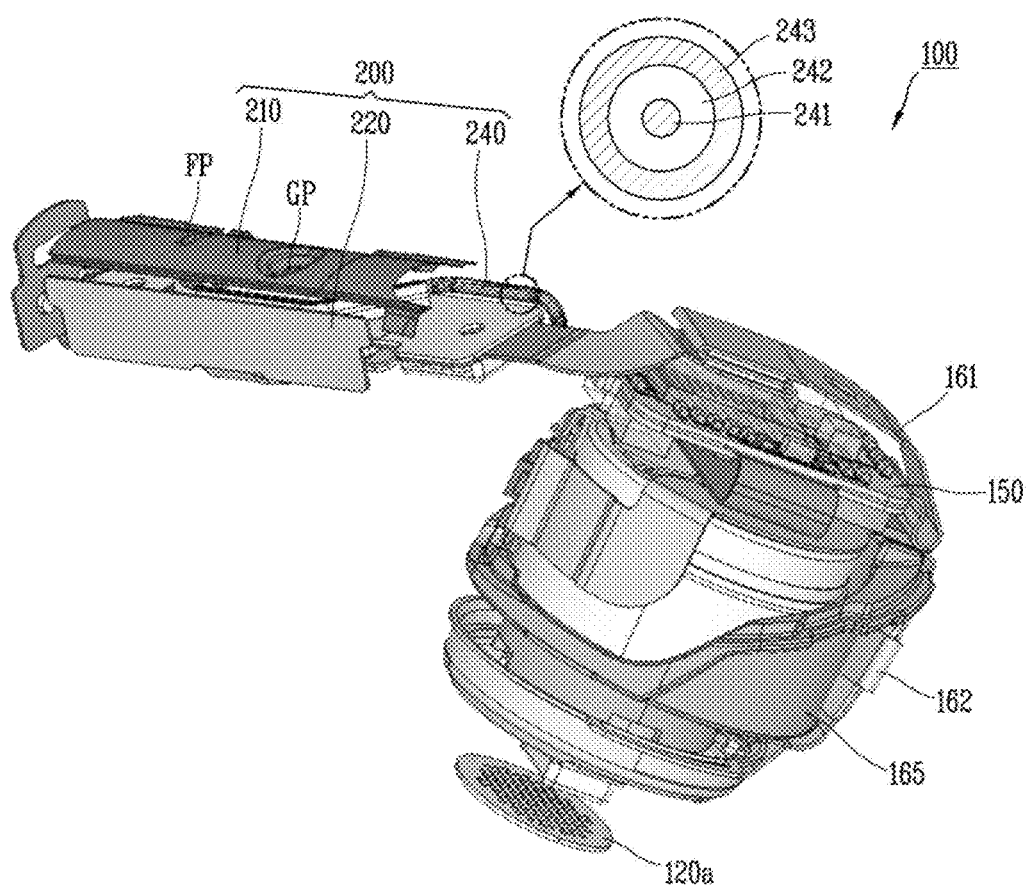
FIGS. 4A and 4B illustrate a configuration including conductive patterns and a mechanism structure disposed inside the earbud according to the present disclosure when the configuration is viewed from different perspectives.
Figure 4B:
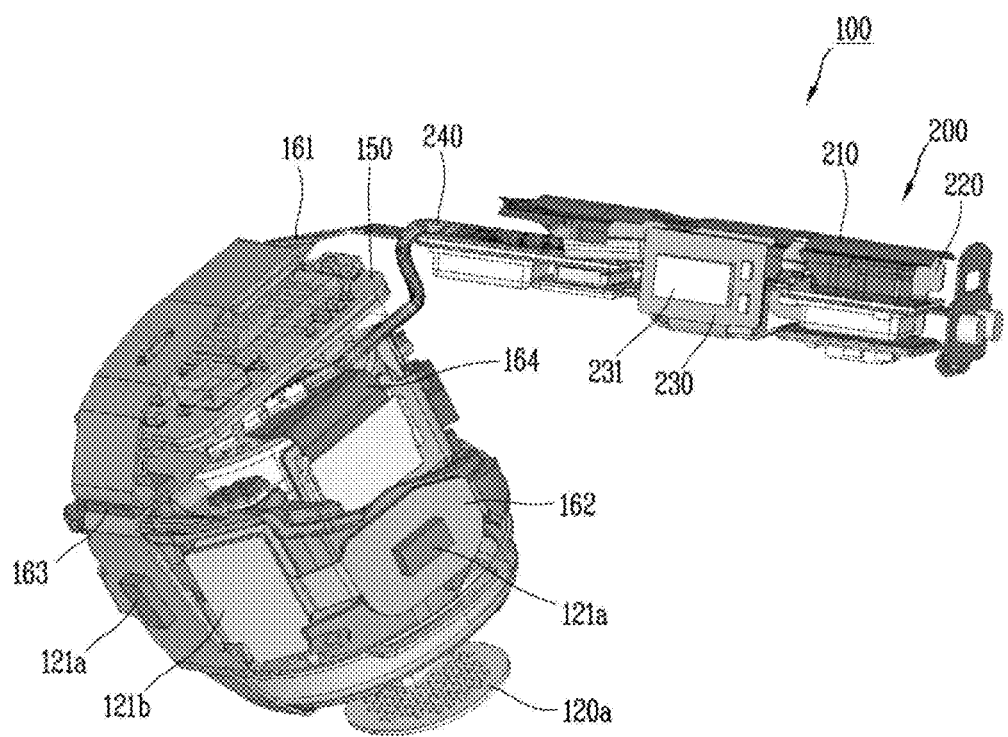

In this regard, FIGS. 4A and 4B illustrate a configuration including conductive patterns and a mechanism structure disposed inside the earbud according to the present disclosure when the configuration is viewed from different perspectives. Referring to FIGS. 2 to 4B, the earbud 100 may be configured to include a housing 120, a radiator 200, and a printed circuit board (PCB) 150. The radiator 200 may be configured to radiate radio signals to perform wireless communication with an electronic device outside the earbud 100. The radiator 200 may be referred to as the antenna 200 because the radiator 200 transmits and receives radio signals.

The housing 120 may have the main body portion 120b with the speaker port 120a and the stoke 122 extending from the main body portion 120b. The radiator 200 may be disposed in the stoke 122 and configured to radiate radio signals to the outside of the earbud 100. The PCB 150 may be electrically connected to the radiator 200.

The radiator 200 may be configured to include a first conductive pattern 210 and a second conductive pattern 220. The radiator 200 may be configured to further include a connection portion 240. The connection portion 240 may be implemented as an RF cable, but the present disclosure is not limited thereto. The first conductive pattern 210 may be formed on a first surface in the stoke 122. The second conductive pattern 220 may be formed on a second surface perpendicular to the first surface in the stoke 122. The connection portion 240 may be configured to electrically connect the first conductive pattern 210 and the PCB 150.

The first conductive pattern 210 and the connection portion 240 may be configured to radiate signals in a first frequency band. The first conductive pattern 210 and the second conductive pattern 220 may be configured to radiate signals in a second frequency band different from the first frequency band. As an example, the second frequency band may be a frequency band higher than the first frequency band, but the present disclosure is not limited thereto.

The connection portion 240 may be configured to include a signal line 241, a dielectric 242, and a ground 243 formed therein. The connection portion 240 may be implemented as a coaxial cable including a signal line 241, a dielectric 242, and a ground 243, but the present disclosure is not limited thereto. The signal line 241 of the coaxial cable 240 may be connected to the first conductive pattern 210. The signal line 241 of the coaxial cable 240 may be connected to a power feeding connection portion FP of the first conductive pattern 210. The ground 243 of the coaxial cable 240 may be connected to the ground of the PCB 150. The ground 243 of the coaxial cable 240 may be connected to the first conductive pattern 210. The ground 243 of the coaxial cable 240 may be connected to the ground connection portion GP of the first conductive pattern 210.

The ground 243 of the coaxial cable 240 disposed horizontally on the first conductive pattern 210 may radiate a first signal in the first frequency band to operate as a radiator. The ground 243 of the coaxial cable 240 may be disposed parallel to the first conductive pattern 210 in a lower area of the first conductive pattern 210.

The second conductive pattern 220 may be configured to include a touch sensor. The first conductive pattern 210 and the second conductive pattern 220 may be formed to a predetermined length on a substantially vertical surface. The first conductive pattern 210 may be formed to a first length in a first axis direction of the stoke. The second conductive pattern 220 may be formed to a second length in the first axis direction. The first length of the first conductive pattern 210 may be formed to be equal to a length in a predetermined range from 14.6 mm, but the present disclosure is not limited thereto. The second length of the second conductive pattern 220 may be formed to be equal to a length in a predetermined range from 13.6 mm, but the present disclosure is not limited thereto. The radiator 200 may further include a third conductive pattern 230. The third conductive pattern 230 disposed on a third surface may be configured to include a force sensor 231.

The first conductive pattern 210 and the coaxial cable 240 may be configured to radiate signals in the first frequency band. The first conductive pattern 210 and the second conductive pattern 220 may be configured to radiate signals in the second frequency band higher than the first frequency band. The first frequency band may be a frequency band with a center frequency of 2.3 GHz to perform Bluetooth communication with an electronic device, but the present disclosure is not limited thereto. The second frequency band may be a frequency band with a center frequency of 2.6 GHz to perform the Bluetooth communication, but the present disclosure is not limited thereto.

Figure 5A:
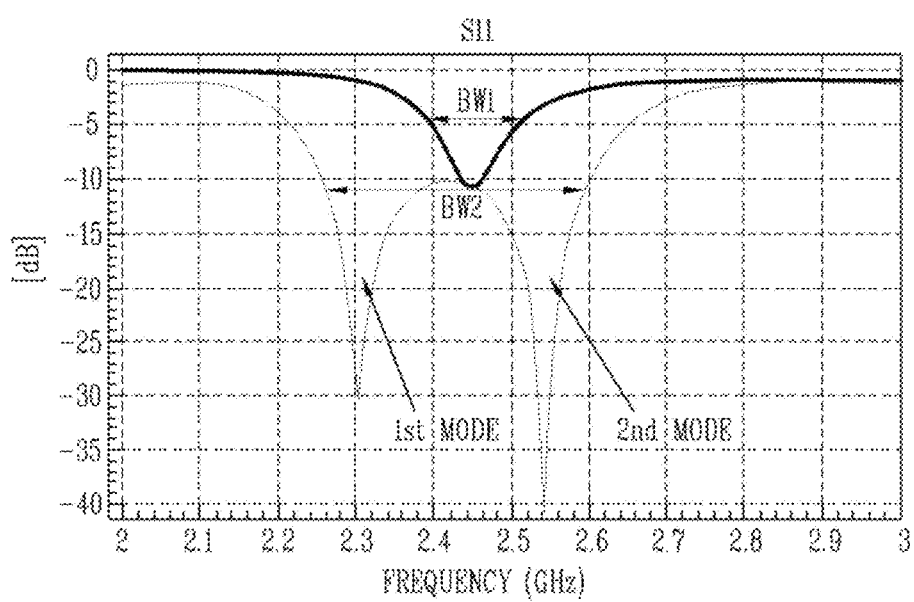
FIG. 5A compares the reflection coefficient characteristics of a radiator structure having a signal conductive pattern and reflection coefficient characteristics corresponding to the frequency of the earbud in which a radiator structure of FIGS. 4A and 4B is disposed.

In this regard, FIG. 5A compares the reflection coefficient characteristics of a radiator structure having a signal conductive pattern and reflection coefficient characteristics corresponding to the frequency of the earbud in which the radiator structure of FIGS. 4A and 4B is disposed. FIGS. 5B and 5C show reflection coefficient changes due to the deformation of RF cables and FPCBs in single-mode and dual-mode antenna structures.

Referring to FIGS. 4A and 4B, the earbud may transmit and receive radio signals in the broadband frequency range by the first and second conductive patterns 210 and 220 formed on the substantially vertical surface and the coaxial cable 240 connected to the first conductive pattern 210. Referring to FIGS. 2 to 5A, the radiator 200 having the first and second conductive patterns 210 and 220 and the connection portion 240 may operate as an antenna having dual-resonance characteristics in the first frequency band and the second frequency band. Meanwhile, the radiator structure having the single conductive pattern operates an antenna having single-resonance characteristics in a frequency band between the first and second frequency bands.

In this regard, the first conductive pattern 210 formed on the first surface and the coaxial cable formed on the first surface may be configured to radiate a first signal in the first frequency band. Meanwhile, the first conductive pattern 210 and the second conductive pattern 220 formed on the second surface perpendicular to the first surface may be configured to radiate a second signal in the second frequency band. As an example, the first frequency band may be the 2.3 GHz band, and the second frequency band may be a frequency band higher than the first frequency band, but the present disclosure is not limited thereto. As an example, the second frequency band may be the 2.55 GHz band or the 2.6 GHz band, but the present disclosure is not limited thereto.

Meanwhile, the antenna structure inside the earbud according to the present disclosure may be formed in a structure in which FPCBs, on which a plurality of electronic components may be disposed, are connected to each other. In this regard, an FPCB 161 disposed in an upper portion of the PCB 150 may be connected to a second FPCB 162. The ground pattern of the FPCB 161 and the ground pattern of the second FPCB 162 may be connected to each other. A plurality of proximity sensors 121a may be provided on a side surface of the second FPCB 162, and a voice pickup unit (VPU) 121b may be disposed between the proximity sensors 121a. A connection FPCB 164 having one end configured to connect to the PCB 150 may have the other end configured to connect to the FPCB 161.

Meanwhile, referring to FIG. 5A, the operating frequency of the antenna provided in the earbud performing wireless communication through Bluetooth may be configured as a predetermined bandwidth with a center frequency of about 2.45 GHz. In this regard, the operational bandwidth BW1 of the antenna operating in the single-frequency band may be set to be about 100 MHz. In wireless communication through Bluetooth, the frequency bandwidth may be set to range from about 2.4 GHz to 2.4835 GHz. The operational bandwidth BW1 of the antenna which is set to be about 100 MHz may cover a bandwidth for Bluetooth wireless communication. However, a change in antenna performance may occur due to the production deviation of an antenna disposed inside the earbud or may occur when the earbud is inserted into an ear and used. Accordingly, it is difficult to apply an antenna having a bandwidth of about 100 MHz to the earbud.

Meanwhile, the operational bandwidth BW2 of the antenna operating in the multi-frequency band according to the present disclosure may be set to be about 400 MHz. In this regard, the operational bandwidth of the antenna according to the present disclosure may range from about 2.25 GHz to 2.6 GHz, and the operational bandwidth BW2 may be set to be about 450 MHz. Accordingly, the antenna having the dual-band resonance characteristics according to the present disclosure may be applied to the earbud. In this regard, it is possible to use the earbud stably even when a change in antenna performance occurs due to the production deviation of an antenna disposed inside the earbud or occurs when the earbud is inserted into an ear and used.

Specifically, the change in antenna performance may occur due to 1) the permittivity deviation of a structure disposed inside the earbud, 2) the assembly deviation of a structure disposed inside the earbud, and 3) a user environment deviation during the use of the earbud. For example, an antenna resonance frequency deviation of about 45 to 90 MHz may occur according to a permittivity deviation of about 5 to 10%. The assembly deviation due to the flexible printed circuit board disposed inside the earbud may be larger than the assembly deviation of other components. For example, an antenna resonance frequency deviation of about 170 MHz may occur due to the form and arrangement errors of the assembled FPCB. Accordingly, the present disclosure is intended to present a broadband antenna structure that is disposed inside the earbud and that has a bandwidth of about 400 MHz or more. To this end, the present disclosure is intended to preset a dual-mode broadband antenna structure operating in a first mode in the first frequency band, which is a low-frequency band, and in a second mode in the second frequency band, which is a high-frequency band.

Meanwhile, a change in antenna structure may occur according to a use environment and the deformation of an FPCB and RF cable in the antenna structure inside the earbud, as presented in FIGS. 4A and 4B. In this regard, FIG. 5B shows reflection coefficient changes due to the deformation of RF cables and FPCBs in a single-mode antenna structure having only a first conductive pattern formed in the earbud of FIGS. 4A and 4B. FIG. 5C shows reflection coefficient changes due to the deformation of RF cables and FPCBs in a dual-mode antenna structure having a first conductive pattern and a second conductive pattern connected to an RF cable inside the earbud of FIGS. 4A and 4B.

Referring to FIGS. 4A, 4B, and 5B(a), the resonance frequency of the single-mode antenna may be changed from a frequency lower than 2.2 GHz to a frequency higher than 2.6 GHz according to the deformation and vibration of the FPCBs 161 and 162. In this regard, the resonance frequency may be moved by about 0.4 GHz according to the deformation and vibration of the FPCBs 161 and 162. Referring to FIGS. 4A, 4B, and 5B(b), the resonance frequency of the single-mode antenna may be changed from about 2.45 GHz to 2.3 GHz, which is a lower frequency, according to the deformation and vibration of the RF cable 240. In this regard, the resonance frequency may be moved by about 0.2 GHz according to the deformation and vibration of the RF cable 240. Accordingly, considering both the deformation and vibration of the RF cable 240 and the deformation and vibration of the FPCBs 161 and 162, the resonance frequency of the single-mode antenna may be changed by about 0.6 GHz (=0.4 GHz+0.2 GHz).

Referring to FIGS. 4A, 4B, and 5C(a), the dual-mode antenna 200 may be designed to have dual resonance in a band of about 2.3 GHz band and in a band of about 2.6 GHz. Referring to FIGS. 4A, 4B, and 5C(b), the operational antenna of the antenna is changed to a band of about 2.2 GHz and a band of about 2.4 GHz according to the deformation and vibration of the RF cable 240 and the deformation and vibration of the FPCBs 161 and 162. Accordingly, considering both the deformation and vibration of the RF cable 240 and the deformation and vibration of the FPCBs 161 and 162, the degree of change in the resonance frequency is more reduced in the dual-mode antenna 200 than in single-mode antennas. The dual-mode antenna 200 has a radiation contribution component due to the connection portion and other conductive patterns in addition to a radiation contribution component due to the first conductive pattern 210 in the first and second frequency bands. Accordingly, the degree of change in the resonance frequency due to other environmental changes, for example, the deformation and vibration of the cable 240 and the FPCBs 161 and 162 appear to be smaller in the dual-mode antenna 200 than in the single-mode antenna.

Meanwhile, even when broadband operation is performed like the dual-mode antenna 200, it is necessary to minimize the change in the resonance frequency due to the deformation and vibration of a connection structure. The FPCBs 161 and 162 may be attached to a cradle structure such as a metal frame 165 through an adhesive tape in order to minimize the shift of the resonance frequency due to the deformation and vibration of the FPCBs 161 and 162. A guide structure for guiding the RF cable 240 may be installed in order to minimize the shift of the resonance frequency due to the deformation and vibration of the RF cable 240.

A current formed in the conductive pattern of the antenna structure disposed inside the earbud according to the present disclosure may be coupled to an FPCB and an RF cable adjacent to the conductive pattern to affect antenna characteristics. In this regard, FIG. 6A shows a current distribution formed in conductive patterns, a metal frame, an FPCB, and an RF cable disposed inside the earbud according to the present disclosure. Meanwhile, FIG. 6B shows a current distribution formed in conductive patterns and an RF cable disposed inside the earbud of FIG. 6A.

Referring to FIGS. 4A, 4B, and 6A, a surface current distribution may be formed in the first conductive pattern 210 and the second conductive pattern 220 and coupled to adjacent electronic components. Referring to FIGS. 6A(a) and 6A(b), a high current distribution may be formed in the RF cable 240, the PCB 150, and the FPCBs 161 and 162 adjacent to the first and second conductive patterns 210 and 220. Also, a high current distribution may be formed in the metal frame 165, which operates as a ground.

Referring to the surface current distribution of FIG. 6A, the current formed in the FPCBs 161 and 162 and the RF cable 240 rather than the antenna itself may affect antenna matching performance. In particular, the shapes of the FPCB 161 and the RF cable 240 adjacent to the PCB 150 corresponding to a mainboard are factors that can greatly affect the antenna matching performance. In this regard, the RF cable 240 and the FPCB 161 may be components that may be vibrated while the earbud is in use. Accordingly, in addition to the performance deviation of an antenna due to the assembly deviation of the RF cable and the FPCB as shown in FIG. 5B, the performance degradation of the antenna may occur even while the earbud is in use. However, through the dual-mode broadband antenna structure according to the present disclosure, wireless communication is stably possible even when the antenna performance is changed due to the assembly deviation of and the in-use vibration of the RF cable and the FPCB as shown in FIG. 5C.

Referring to FIGS. 2 to 5A and 6B(b), a first mode operating in a band of 2.3 GHz, which is the first frequency band, may be implemented by a fourth conductive pattern 240 implemented as a connection portion such as an RF cable and the first conductive pattern 210. The first conductive pattern 210 may be implemented by forming a metal pattern on a dielectric structure as a laser direct structuring (LDS) antenna through an LDS process. The ground 243 of the RF cable 240 corresponding to the fourth conductive pattern may be implemented as a radiator together with the first conductive pattern 210.

Referring to FIGS. 2 to 5A and 6B(b), in a second mode operating in a band of 2.55 GHz, which is the second frequency band, signals may be radiated through a gap area G corresponding to an open slot implemented between the first conductive pattern 210 and the second conductive pattern 220. The second conductive pattern 220 may be implemented as a slide-type slide touch sensor. The function of the earbud may be manipulated by the slide touch sensor. As an example, the volume of the sound of content received through the earbud may be adjusted by the slide touch sensor, but the present disclosure is not limited thereto.

Meanwhile, the length of the open slot may be almost equal to a first length of the first conductive pattern 210, which is an LDS antenna, in a predetermined range. Accordingly, the open slot and the LDS antenna may be implemented to have an electric length that allows operating in the 2.4 GHz band. Due to the orthogonality of electric fields in the first mode and the second band, interference between the modes may be minimized. Thus, a broadband antenna having dual-resonance characteristics with minimal interference between modes in the first frequency band and the second frequency band may be implemented.

Figure 7:
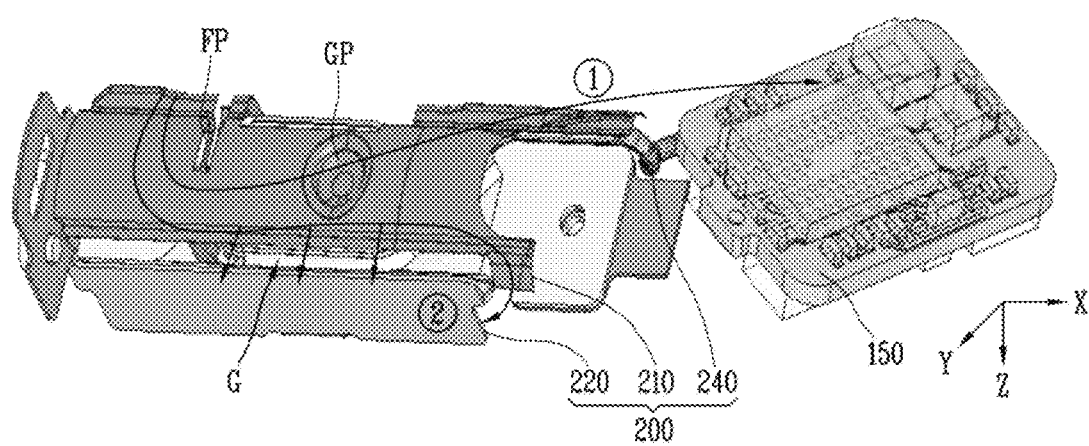
FIG. 7 illustrates an operating principle considering a current distribution in a configuration in which an antenna structure disposed inside the earbud according to the present disclosure is connected to a PCB.

Meanwhile, the antenna structure disposed inside the earbud according to the present disclosure may operate in a dual mode to allow broadband operation. In this regard, FIG. 7 illustrates an operating principle considering a current distribution in a configuration in which an antenna structure placed inside the earbud according to the present disclosure is connected to a PCB.

Referring to FIGS. 2 to 7, first and second currents may be generated on the first and second conductive patterns 210 and 220, respectively. A first direction of the first current formed in the first conductive pattern 210 and the coaxial cable 240 on the first surface may be orthogonal to a second direction of the second current from in the second conductive pattern 220 of the second surface perpendicular to the first surface. In this regard, the first direction of the first current formed on the first surface may be an x-axis direction or a y-axis direction on the first conductive pattern 210. Meanwhile, the first direction of the second current formed on the second surface may be a z-axis direction on the second conductive pattern 220. Thus, the radiator 200 may perform broadband operation in the first frequency band and the second frequency band.

One end of the first conductive pattern 210 and one end of the second conductive pattern 220 may be spaced apart from each other. A current formed in the first conductive pattern 210 may be coupled to the second conductive pattern 220 in the second frequency band. Thus, the first conductive pattern 210 and the second conductive pattern 220 may be spaced apart by a gap G to operate as a coupling antenna.

Referring to FIGS. 4A to 7, the dual-mode antenna structure according to the present disclosure may be summarized with the following technical features. 1) In the dual-mode antenna structure, two branch structures may be formed in the same direction. In this regard, a first branch structure and a second branch structure operating in the first mode and the second mode, respectively, may be formed in the same first axial direction. 2) The RF cable 240 may be disposed near the first branch structure by the current formed on the first conductive pattern 210. In this regard, the RF cable 240 greatly affects the antenna resonance of the 2.3 GHz band, which is the first frequency band. 3) The second branch structure may be formed as the second conductive pattern 220 corresponding to the slide sensor. In this regard, the slide sensor has a large effect on the antenna resonance of the 2.6 GHz band, which is the second frequency band.

The length of the slide sensor corresponds to the resonance length of the second frequency band. The length of the slide sensor corresponds to the length of the first conductive pattern 210 and the second conductive pattern 220 spaced apart by the gap G.

4) The first and second FPCBs 161 and 162 corresponding to the main FPCB and the audio FPCB may be electrically connected together with the metal frame 165 using a metal gasket 163. Accordingly, it is possible to secure a stable ground current between the metal frame 165 and the first and second FPCBs 161 and 162. Through such a stable ground engagement structure, it is possible to prevent the generation of a high-order mode formed by a loop current corresponding to a connection structure between the conductive patterns and the FPCBs. Through the ground connection structure between the metal frame 165 and the first and second FPCBs 161 and 162, it is possible to prevent loop disturbance from being formed due to the generation of a higher-order mode by a loop current.

The radiator 200 of the earbud 100 according to the present disclosure may further include an additional conductive pattern other than the first and second conductive patterns 210 and 220. In this regard, FIGS. 8A and 8B are internal perspective views of a conductive pattern arrangement structure inside the earbud when the structure is viewed from different perspectives.

Figure 8A:
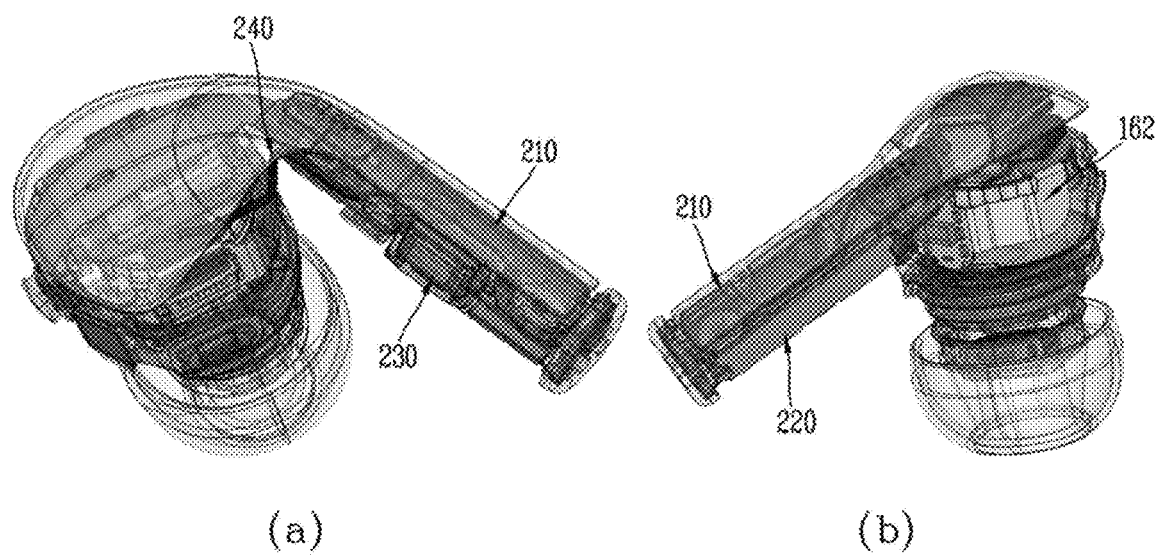
FIGS. 8A and 8B are internal perspective views of a conductive pattern arrangement structure inside the earbud when the conductive pattern arrangement structure is viewed from different perspectives.
Figure 8B:
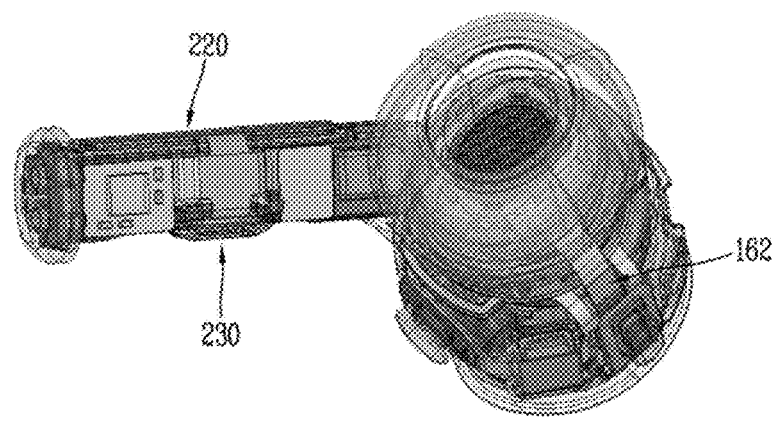

FIG. 8A(a) is a first-direction internal perspective view illustrating the first surface and the third surface on which the first conductive pattern 210 and the third conductive pattern 230 are formed inside the earbud. FIG. 8A(b) is a second-direction internal perspective view illustrating the first surface and the second surface on which the first conductive pattern 210 and the second conductive pattern 220 are formed inside the earbud. FIG. 8B is a third-direction internal perspective view illustrating a fourth surface facing the first surface inside the earbud. Referring to FIG. 8B, the second conductive pattern 220 and the third conductive pattern 230 may be formed on the second surface and the third surface, which are both sides of the fourth surface.

Referring to FIGS. 2 to 8B, the radiator 200 may further include the third conductive pattern 230 formed on the third surface, which faces the second conductive pattern 220 disposed on the second surface. The third conductive pattern 230 disposed on the third surface may be configured to include the force sensor 231. In this regard, the connection portion 240 that may be implemented as an RF cable may be referred to as the fourth conductive pattern 240. The third conductive pattern 230 may be configured to radiate signals in a third frequency band higher than the second frequency band. The third frequency band may be a 5 GHz band or a 7 GHz band for Bluetooth communication, but the present disclosure is not limited thereto.

The third conductive pattern 230 may be disposed inside the stoke 122, which corresponds to a handle of the earbud, and thus disposed adjacent to the first conductive pattern 210 operating as an antenna. Also, the third conductive pattern 230 is disposed to face the second conductive pattern 220. Accordingly, the third conductive pattern 230 may be disposed adjacent to another antenna element to act as a disturbing factor for the radiation characteristics of the antenna element. However, the resonance frequency band of the third conductive pattern 230 may be set to a 5 GHz band, a 7 GHz band, or an 8 GHz band, and the third conductive pattern 230 may be designed so as not to significantly affect the radiation characteristics of other antenna elements.

Accordingly, the third conductive pattern 230 may be designed to operate in a resonance frequency band of about 7 GHz when operating as an antenna. On the other hand, the third conductive pattern 230 has an electrical length at which the third conductive pattern 230 does not operate as a radiator in the 2.4 GHz, which is the Bluetooth (BT) operating frequency of earbuds. In other words, the third conductive pattern 230 operating as a force sensor may be implemented to operate as an antenna not in the Bluetooth (BT) frequency band but in another frequency band, for example, about 7 GHz band.

Accordingly, conductive patterns other than the first conductive pattern 210 constituting the radiator 200 of the earbud may operate as sensors or may be implemented as RF cables. In this regard, the second conductive pattern 220 may operate as a touch sensor, and the third conductive pattern 230 may operate as a force sensor. Also, the fourth conductive pattern 240 may be implemented as an RF cable. Meanwhile, similar to the first conductive pattern 210, the second conductive pattern 220 and the third conductive pattern 230 may be formed on dielectric structures. Therefore, the second conductive pattern 220 and the third conductive pattern 230 may be formed on a second dielectric structure and a third dielectric structure, respectively. Thus, the second conductive pattern 220 and the third conductive pattern 230 may be referred to as a touch sensor and a force sensor, respectively.

Figure 9A:
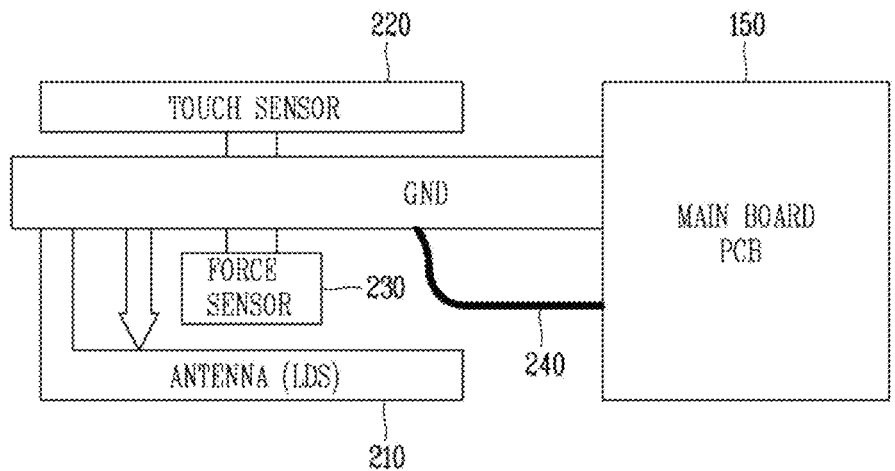
FIG. 9A illustrates a structure in which a plurality of conductive patterns constituting a radiator of the earbud according to the present disclosure are connected to a ground.

Meanwhile, a plurality of conductive patterns constituting the radiator 200 of the earbud according to the present disclosure may be connected to signal lines and/or the ground. In this regard, FIG. 9A illustrates a structure in which the plurality of conductive patterns constituting the radiator of the earbud according to the present disclosure are connected to the ground. Referring to FIG. 9A, as the plurality of conductive patterns operating as the radiator are connected to the ground, this may result in a reduction in the size of the radiator and may allow for broadband operation. Also, as the conductive patterns operating as the touch sensor and the force sensor are connected to the ground, it is possible to improve sensing accuracy and also reduce the impact of changes in the surrounding environments.

Referring to FIGS. 2 to 9A, the signal pattern of the first conductive pattern 210 may be formed as a conductive pattern having a predetermined shape to radiate signals in the first frequency band and the second frequency band. The ground pattern of the first conductive pattern 210 may be electrically connected to the ground of a coaxial cable 240. The signal pattern of the second conductive pattern 220 may be formed as a conductive pattern having a predetermined shape so as to radiate signals in the second frequency band and operate as the touch sensor. The ground pattern of the second conductive pattern 220 may be electrically connected to the ground of the coaxial cable 240. The signal pattern of the third conductive pattern 230 may be formed as a conductive pattern having a predetermined shape so as to operate as the force sensor. The ground pattern of the third conductive pattern 230 may be electrically connected to the ground of the coaxial cable 240.

Figure 9B:
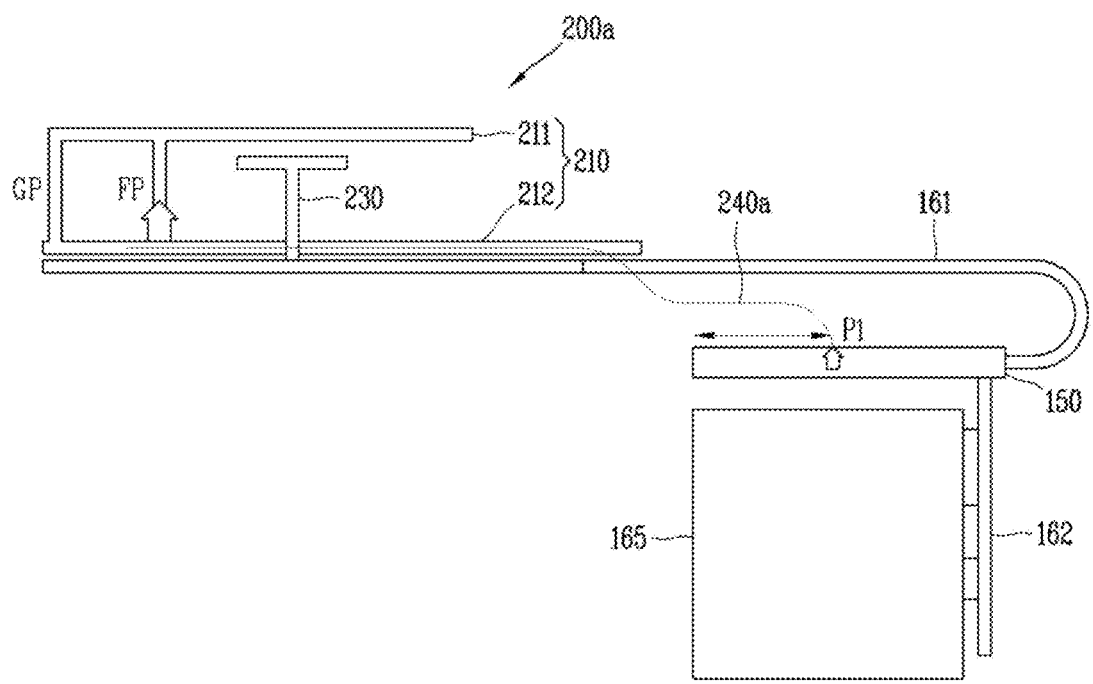
FIG. 9B shows a single-mode antenna and a mechanism structure inside the earbud.
Figure 9C:
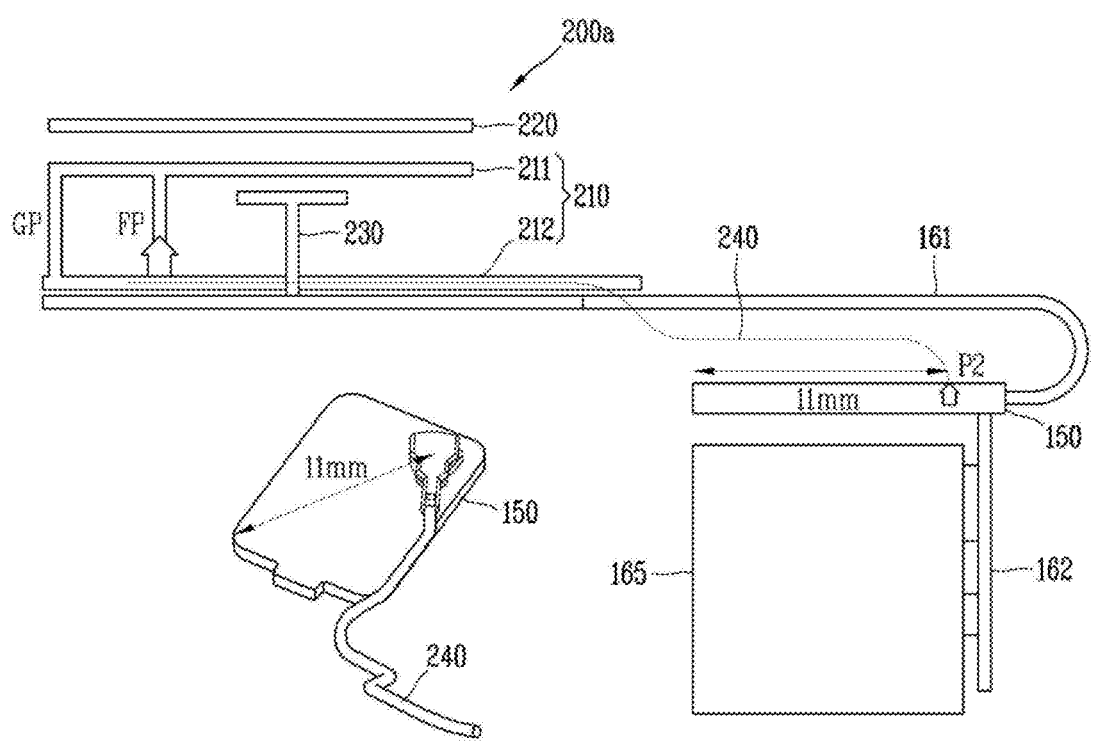
FIG. 9C shows a dual-mode antenna and a mechanism structure inside the earbud according to the present disclosure.

The radiator and the mechanism structure inside the earbud according to the present disclosure may be implemented as shown in FIGS. 9B and 9C. In this regard, FIG. 9B shows a single-mode antenna and a mechanism structure inside the earbud. FIG. 9C shows a dual-mode antenna and a mechanism structure inside the earbud according to the present disclosure.

Referring to FIG. 9B, a single-mode antenna 200a inside the earbud may have only the first conductive pattern 210 or may further include the third conductive pattern 230 including the force sensor. An RF cable 240a connected to the first conductive pattern 210 may be connected to the PCB 150 at a first position P1. In this regard, the single-mode antenna 200a may be configured to have a single resonance at about 2.45 GHz, like the single-mode antenna of FIG. 5A.

Referring to FIG. 9C, the first conductive pattern 210 and the second conductive pattern 220 having the touch sensor may be coupled to the dual-mode antenna 200 inside the earbud. Referring to FIGS. 9A and 9C, the dual-mode antenna 200 may operate as a radiator that radiates signals through the first conductive pattern 210 and the RF cable in the first frequency band. The RF cable 240 connected to the first conductive pattern 210 may be connected to the PCB 150 at a second position P2. The first conductive pattern 210 may be configured to include a signal pattern 211 and a ground pattern 212. The signal pattern 211 may be connected to the power feeding unit FP, and the ground pattern 212 may be connected to the ground connection portion GP The second position P2 where the RF cable 240 is connected may be formed more adjacent to the other end of the PCB 150 than the first position P1. One end of the PCB 150 may be formed adjacent to the end of the ground pattern 212 of the first conductive pattern 210. The other end of the PCB 150 may be connected to the FPCBs 161 and 162. Thus, as the length of the RF cable 240 in the dual-mode antenna 200 increases, the radiator composed of the first conductive pattern 210 and the RF cable 240 may operate as a radiator in a frequency band lower than 2.45 GHz.

In the dual-mode antenna 200, the connection position of the RF cable 240 may be formed to be longer than the connection position of the RF cable 240a of the single-mode antenna 200a. In the dual-mode antenna 200, the connection position of the RF cable 240 may be formed in a predetermined range from about 11 mm. In this regard, when the connection position of the RF cable 240 is set to 7 mm or less, the RF cable 240 may be regarded as not operating as a radiator in the first frequency band. Accordingly, the connection position of the RF cable 240 in the dual-mode antenna 200 may be set in the range of 7 mm to 15 mm with respect to about 11 mm. With respect to the antenna operation in the first frequency band, the connection position of the RF cable 240a may be replaced by the length of the RF cable 240a.

Meanwhile, the dual-mode antenna 200 may operate as a radiator that radiates signals through the first and second conductive patterns 210 and 220 in the second frequency band higher than the first frequency band. The second conductive pattern 220 operating as the touch sensor may be implemented as a slide-type slide touch sensor. The dual-mode antenna 200 configured to radiate signals by the first and second conductive patterns 210 and 220 may operate as a radiator in about 2.55 GHz band, which is the second frequency band.

Accordingly, the radiator itself of the dual-mode antenna structure disposed inside the earbud according to the present disclosure may operate similarly to an existing general Bluetooth antenna. In this regard, the first conductive pattern 210, which is a main radiator, operates as a single-resonance antenna. However, the radiator structure may operate as a dual-resonance antenna depending on whether the slide touch sensor is present and where the connection point of the PCB of the mainboard is positioned. Specifically, the difference between positions at which the RF cable 240 and the second conductive pattern 220 having the slide touch sensor are connected to the PCB 150 determines the operating frequency band of the dual-resonance broadband antenna.

The position at which the RF cable 240 is connected to the PCB 150 may be referred to as a mobile switch position. This is because the operating frequency of the first frequency band may be determined according to a position where the RF cable 240 is connected to the PCB 150.

Meanwhile, the radiator inside the earbud according to the present disclosure may be connected to a separate FPCB while being connected to the PCB. In this regard, FIG. 10A shows a configuration in which a radiator inside the earbud according to the present disclosure is connected to a PCB and also is connected to a separate FPCB.

Figure 10A:
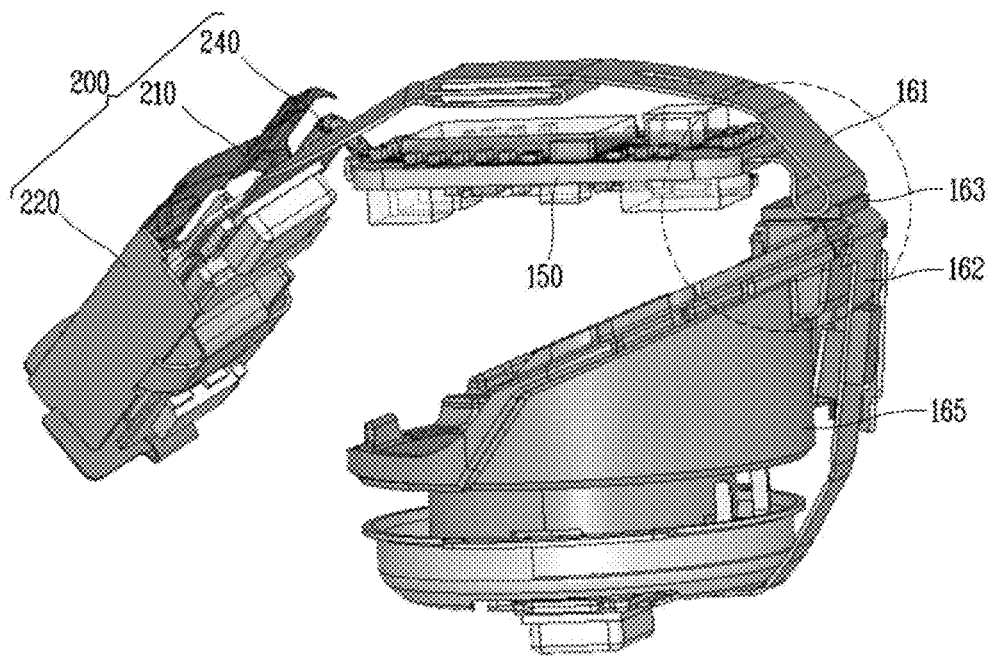
FIG. 10A shows a configuration in which a radiator inside the earbud according to the present disclosure is connected to a PCB and also is connected to a separate FPCB.

Referring to FIG. 10A, the earbud 100 may further include a flexible printed circuit board (FPCB) 161. Also, the earbud 100 may further include a second FPCB 162 separate from the FPCB 161. The FPCB 161 may be configured to connect the first conductive pattern 210 to the PCB 160. The second FPCB 162 may be disposed in a metal frame that forms an inner side area formed as a curved surface of the main body portion.

The FPCB 161 may be formed to surround the metal frame 165 that forms the inner side area formed as the curved surface of the main body portion. The second FPCB 162 may be formed to surround the metal frame that forms the inner side area formed as the curved surface of the main body portion. The ground pattern of the FPCB 161 and the ground pattern of the second FPCB 162 may be electrically connected to the metal frame 165. Also, the metal gasket 163 may be configured to connect the FPCB 161 and the second FPCB 162. Thus, the FPCB 161, the second FPCB 162, and the metal frame 165 may be connected to the ground by the metal gasket 163.

Meanwhile, at least one manipulation unit and at least one interface port may be provided in the outer area of the earbud or between the outer area and the inner area of the earbud according to the present disclosure. In this regard, FIG. 10B illustrates a configuration in which at least one manipulation unit and at least one interface port in the outer area or between the outer area and the internal area of the earbud of FIG. 10A.

Figure 10B:
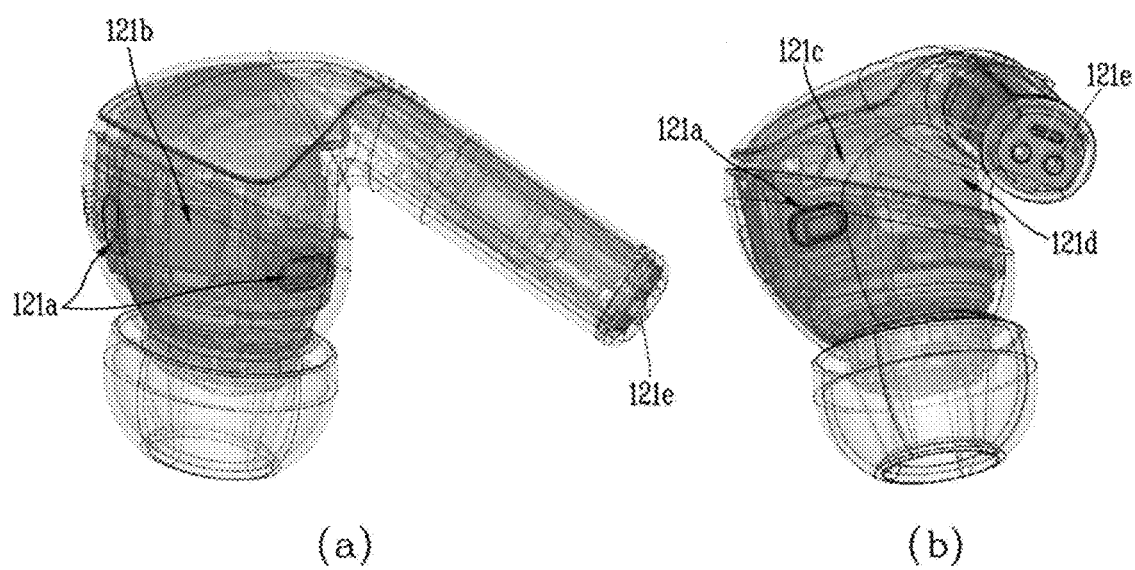
FIG. 10B illustrates a configuration in which at least one manipulation unit and at least one interface port in an outer area or between an outer area and an inner area of the earbud of FIG. 10A.

FIG. 10B(a) shows a configuration in which proximity sensors disposed in one side area of an outer side of the earbud. FIG. 10B(b) shows a configuration in which one of the proximity sensors formed in one side area of the outer side of the earbud and a charging port disposed on the bottom of a stoke are formed in a side area rotated by a predetermined angle compared to FIG. 10B(a).

Referring to FIGS. 2 to 10B, the main body portion 120b may further include the proximity sensor 121a and the VPU 121b disposed in a first side area of the outer side. Also, the main body portion 120b may further include a connector 121c, a battery protection circuit 121d, and a charging port 121e disposed between a second side area of the outer side and the inner side. The FPCB 161 may be disposed between the main body portion 120b and the metal frame 165 disposed in the inner side area of the main body portion 120b. The FPCB 161 may be electrically connected to the proximity sensor 121a, the VPU 121b, the connector 121c, the battery protection circuit 121d, and the charging port 121e.

Figure 11A:
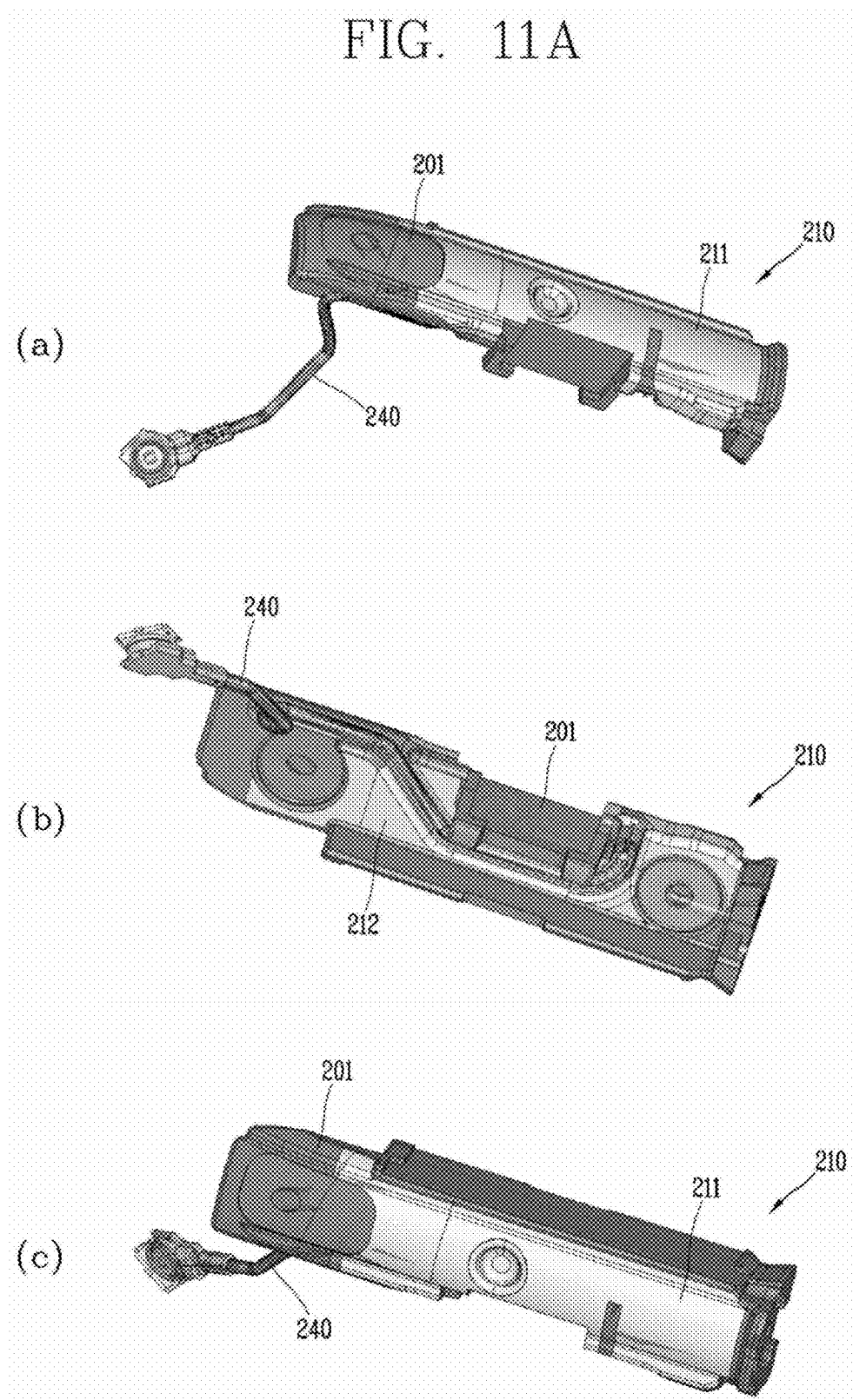
FIGS. 11A and 11B are views illustrating a metal pattern and an interface structure formed on a dielectric structure inside the earbud according to the present disclosure when the metal pattern and the interface structure are viewed from different perspectives.
Figure 11B:
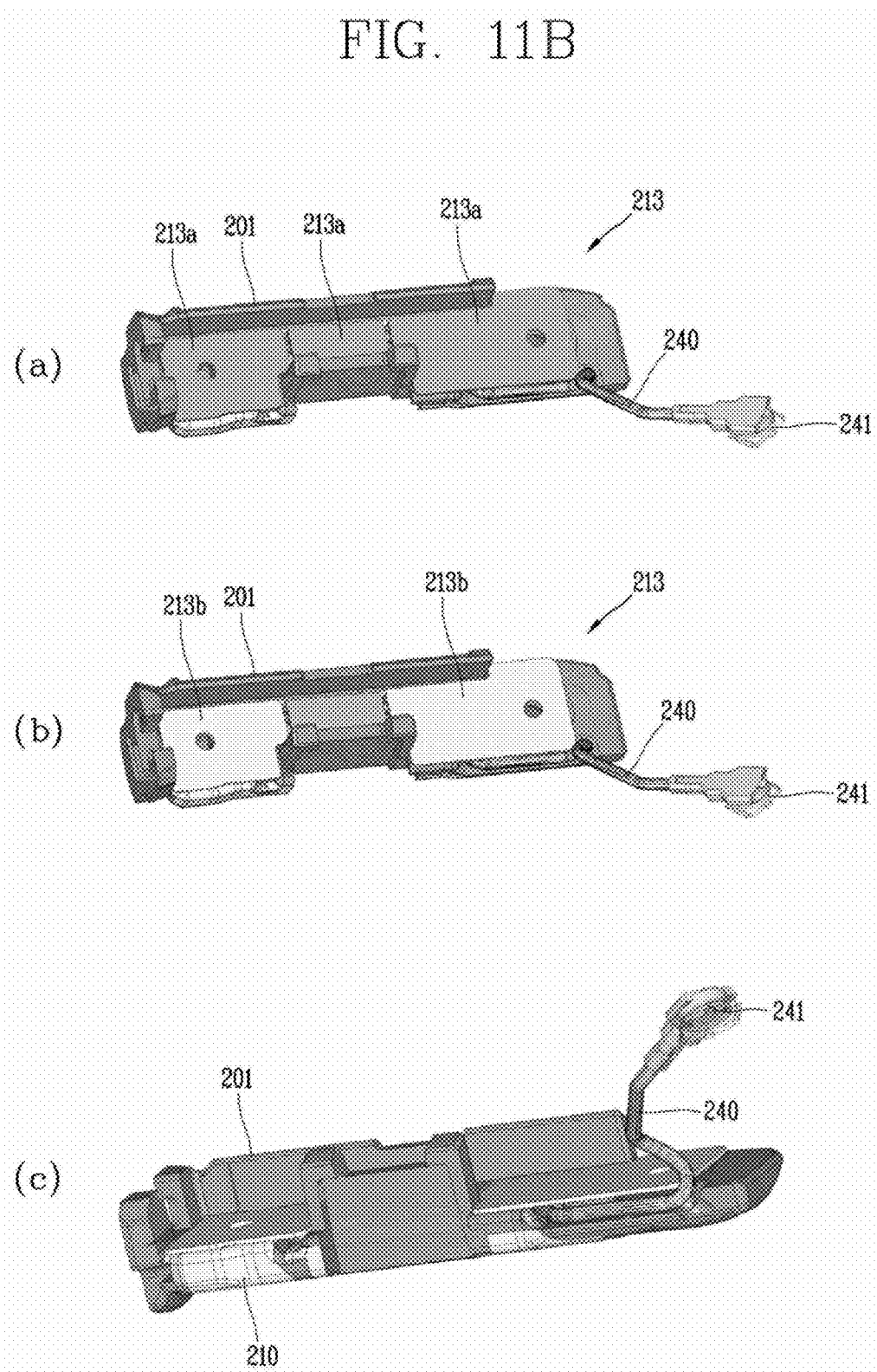

At least one of the conductive patterns constituting the radiator of the earbud according to the present disclosure may be formed on the dielectric structure. In this regard, FIGS. 11A and 11B are views illustrating a conductive pattern and an interface structure formed on a dielectric structure inside the earbud according to the present disclosure when the conductive pattern and the interface structure are viewed from different perspectives. Specifically, FIG.

11A is a view illustrating a structure in which a first conductive pattern of the earbud according to the present disclosure is formed on a dielectric structure when the structure is viewed from different perspectives. Referring to FIG. 11A, the first conductive pattern 210 may be configured such that a first conductive pattern having first conductivity is selectively formed on a dielectric molded part 201 using a laser. Also, a second conductive pattern having second conductivity may be formed on the first conductive pattern 210 by plating.

The signal pattern 211 of the first conductive pattern 210 formed on the front side of the dielectric molded part 201 may be formed by a laser direct structuring (LDS) process in which a second conductive pattern is plated on top of the first conductive pattern. The ground pattern 212 of the first conductive pattern 210 formed on the rear side of the dielectric molded part 201 may also be formed in the LDS process in which the second conductive pattern is plated on top of the first conductive pattern. In this regard, the metal material of the second conductive pattern may be determined so that the second conductivity of the second conductive pattern is higher than the first conductivity of the first conductive pattern. Thus, it is possible to enhance the structural stability of the conductive pattern through the first conductive pattern attached to the surface of the dielectric molded part 201 and improve antenna efficiency through the second conductive pattern. As an example, the second conductive pattern may be formed of gold with about $4.1 \times 10^7$ S/m, but the present disclosure is not limited thereto. The first conductive pattern may be formed of a metal material with about $2 \times 10^7$ S/m, but the present disclosure is not limited thereto. The first conductive pattern 210 may be connected to the RF cable 240 to operate as a radiator in the first frequency band.

The ground pattern of the conductive patterns that constitute the radiator of the earbud according to the present disclosure and the are formed by the LDS process may be electrically connected to another metal structure. In this regard, FIG. 11B shows a structure attached to the ground pattern of the first conductive pattern formed on the rear surface of the dielectric structure of FIG. 11A.

Referring to FIGS. 11A and 11B, a conductive structure 213 may be attached to a ground pattern 212 of the first conductive pattern 210. Accordingly, when the ground pattern 212 of the first conductive pattern 210 is electrically connected to another metal structure, the ground characteristics can be stabilized by the conductive structure 213. The ground pattern of the first conductive pattern 210 may be attached to a ground structure inside the main body portion, for example, a metal frame through the conductive structure 213.

The conductive structure 213 may be implemented as a double-sided conductive tape 213a for attaching the ground pattern 212 of the first conductive pattern 210 to another metal structure. The conductive structure 213 may be implemented to further include a conductive stiffener 213b to be combined with the double-sided conductive tape 213a. In this regard, the conductive stiffener 213b may be implemented with steel use stainless (SUS), but the present disclosure is not limited thereto.

The RF cable 240 connected to the ground pattern 212 of the first conductive pattern 210 operates as a radiator along with the first conductive pattern 210. Thus, the RF cable 240 may be referred to as a ground radiator. The RF cable 240 may be formed separately from the main ground of the earbud structure. The RF cable 240 may be spaced apart from the signal pattern 211 of the first conductive pattern 210 by a gap distance equal to or less than a threshold. As an example, the RF cable 240 may be spaced less than 1.1 mm apart from the first conductive pattern 210 to form a coupling structure.

Figure 12A:
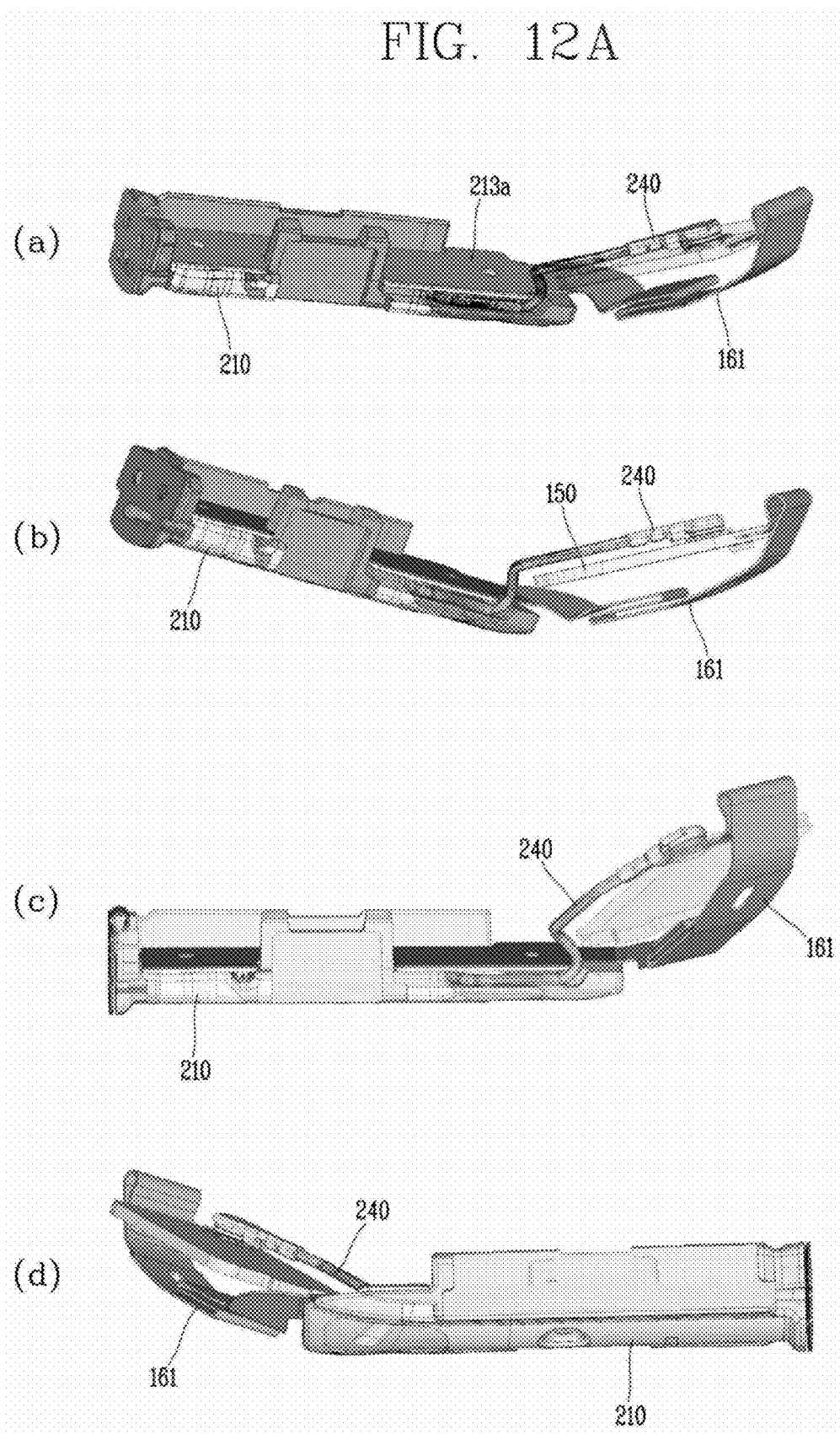
Figure 12C:
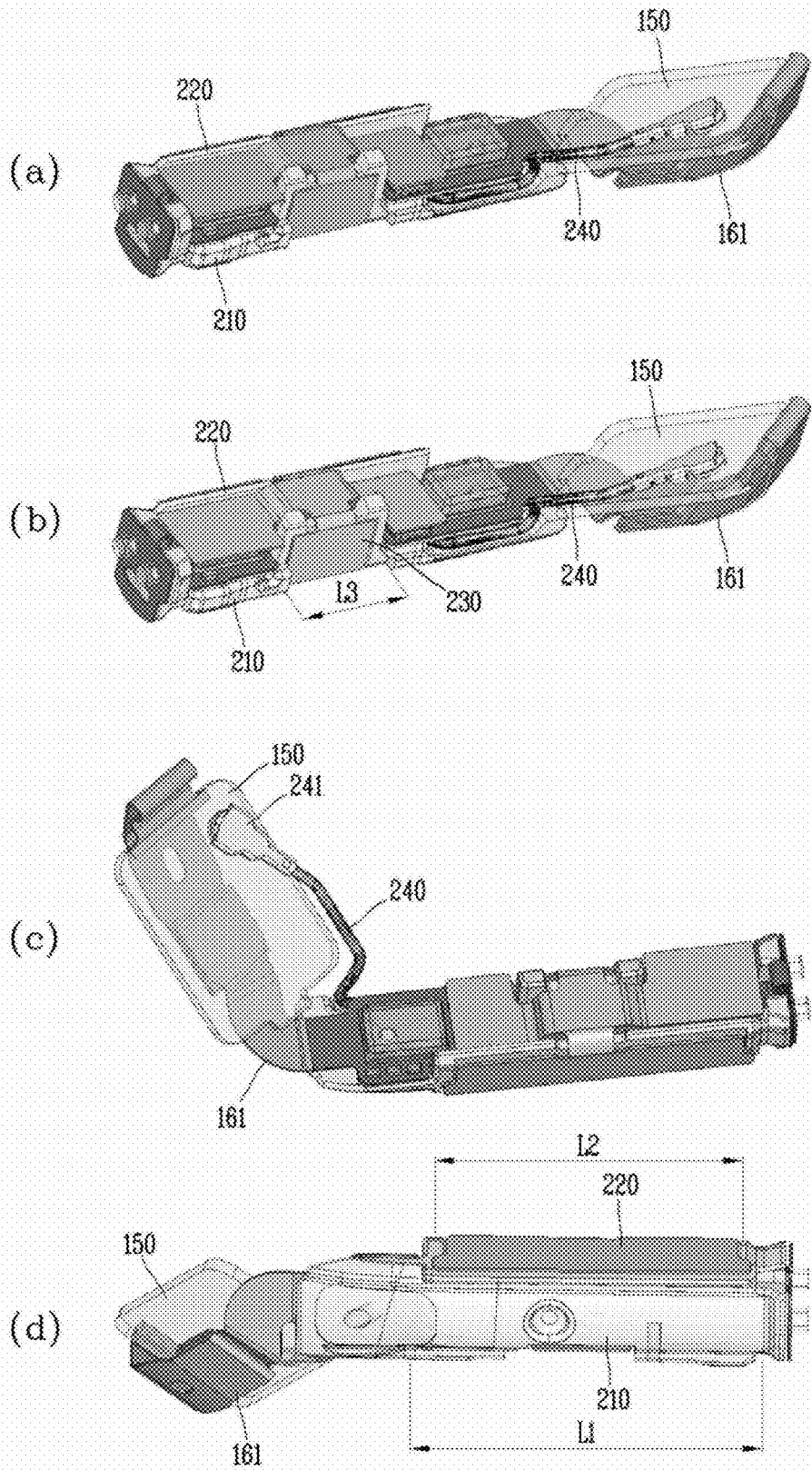

Meanwhile, a structure in which the conductive pattern and electronic components inside the earbud according to the present disclosure are arranged will be described in more detail. In this regard, FIGS. 12A to 12C illustrate a structure in which a conductive pattern and electronic components inside the earbud according to the present disclosure are arranged when the structure is viewed from different perspectives. Referring to FIGS. 10A to 12A, the FPCB 161 may be connected onto the double-sided conductive tape 213a. By electrically connecting the FPCB 161 onto the double-sided conductive tape 213a, the grounds of different conductive patterns may be interconnected to stabilize the ground.

Referring to FIGS. 10A to 12B, a plurality of electronic components may be arranged on the FPCB 161. As an example, microphones 161a and 161b, a charging port 161c, and a connector 161d may be mounted on the FPCB 161. Meanwhile, the FPCB 161 may be electrically connected to the proximity sensor 121a, the VPU 121b, the connector 121c, and the battery protection circuit 121d. The second conductive pattern 220 on which the touch sensor is disposed and the third conductive pattern 230 on which the force sensor is disposed may be disposed on one side and the other side of the FPCB 161. Due to the ground connection structure in which the FPCB 161 is connected onto the double-sided conductive tape 213a, the touch sensor and the force sensor may operate without being affected by changes in the surrounding environment.

Referring to FIGS. 4A, 4B, 7, 10A to 12C, a first length L1 of the first conductive pattern 210 and a second length L2 of the second conductive pattern 220 may be formed to be substantially similar in a predetermined range. As an example, the first length L1 of the first conductive pattern 210 may be implemented in a predetermined range from about 14.8 mm. The second length L2 of the second conductive pattern 220 may be implemented in a predetermined range from about 13.6 mm. The third length L3 of the force sensor formed on the third conductive pattern 230 may be implemented in a predetermined range from about 4.2 mm. Resonance may occur at about 7 GHz or about 8 GHz due to the third length of the force sensor formed on the third conductive pattern 230.

The first conductive pattern 210 may be referred to as an LDS antenna pattern because the first conductive pattern 210 is formed through the LDS process. The second conductive pattern 220 may be referred to as a slide sensor because a touch sensor of a slide structure is disposed thereon. The FPCB 161 may be connected to the touch sensor of the second conductive pattern 220 through a connector 241. An area of the FPCB 161 connected through the connector 241 formed on one end of the RF cable 240 may be referred to as a sensor FPCB. Accordingly, the touch sensor of the second conductive pattern 220 may be electrically connected to the FPCB 161 through the connector 241. Also, the force sensor of the third conductive pattern 230 may be electrically connected to the FPCB 161 through the connector 241.

Meanwhile, the antenna characteristics may be changed depending on the length of the touch sensor in the antenna structure inside the earbud according to the present disclosure. In this regard, FIG. 13 illustrates antenna reflection coefficient characteristics according to a change in the length of the touch sensor in the antenna structure inside the earbud. Referring to FIG. 13, while the second length L2 of the second conductive pattern 220 varies from 10 mm to 13.5 mm, the resonance frequency in the first frequency band is hardly changed. However, while the second length L2 of the second conductive pattern 220 varies from 10 mm to 13.5 mm, the resonance frequency in the second frequency band is transitioned to a low frequency.

Referring to FIGS. 7, 12C, and 13, the effect of the change in the length of the slide touch sensor implemented as the open slot G is a second resonance frequency. The length of the slide touch sensor that can be used for Bluetooth (BT) wireless communication requires a minimum of about 8 mm. Considering the assembly deviation of electronic components such as FPCB, the length of the slide touch sensor may be designed to be 13.5 mm or more based on VSWR 2:1. Meanwhile, as the gap between the first and second resonance frequencies increases due to the position of the RF cable 240 connected to the PCB 150, a longer slide touch sensor is required.

Referring to FIGS. 12C and 13, the first conductive pattern 210 may be formed to the first length L1 in a first axial direction of the stoke. The second conductive pattern 220 may be formed to the second length L2 in the first axis direction. The first length L1 of the first conductive pattern 210 may be formed as a length in a predetermined range from 14.6 mm, but the present disclosure is not limited thereto. The second length L2 of the second conductive pattern 220 may be formed as a length in a range from 8 mm to 14.6 mm, but the present disclosure is not limited thereto. The second length L2 of the second conductive pattern 220 may be set to maintain VSWR 2.5:1 or less across the first and second frequency bands. In this regard, the second length L2 of the second conductive pattern 220 may be formed as a length in a range from 10 mm to 14.6 mm, but the present disclosure is not limited thereto. The second length L2 of the second conductive pattern 220 may be set to maintain VSWR 2:1 or less across the first and second frequency bands. In this regard, the second length L2 of the second conductive pattern 220 may be formed as a length in a range from 13.5 mm to 14.6 mm, but the present disclosure is not limited thereto.

Meanwhile, a plurality of FPCBs may be disposed inside the earbud according to the present disclosure. In this regard, FIGS. 14A to 14C show a structure in which a plurality of FPCBs are disposed and assembled inside the earbud according to the present disclosure.

Figure 14A:
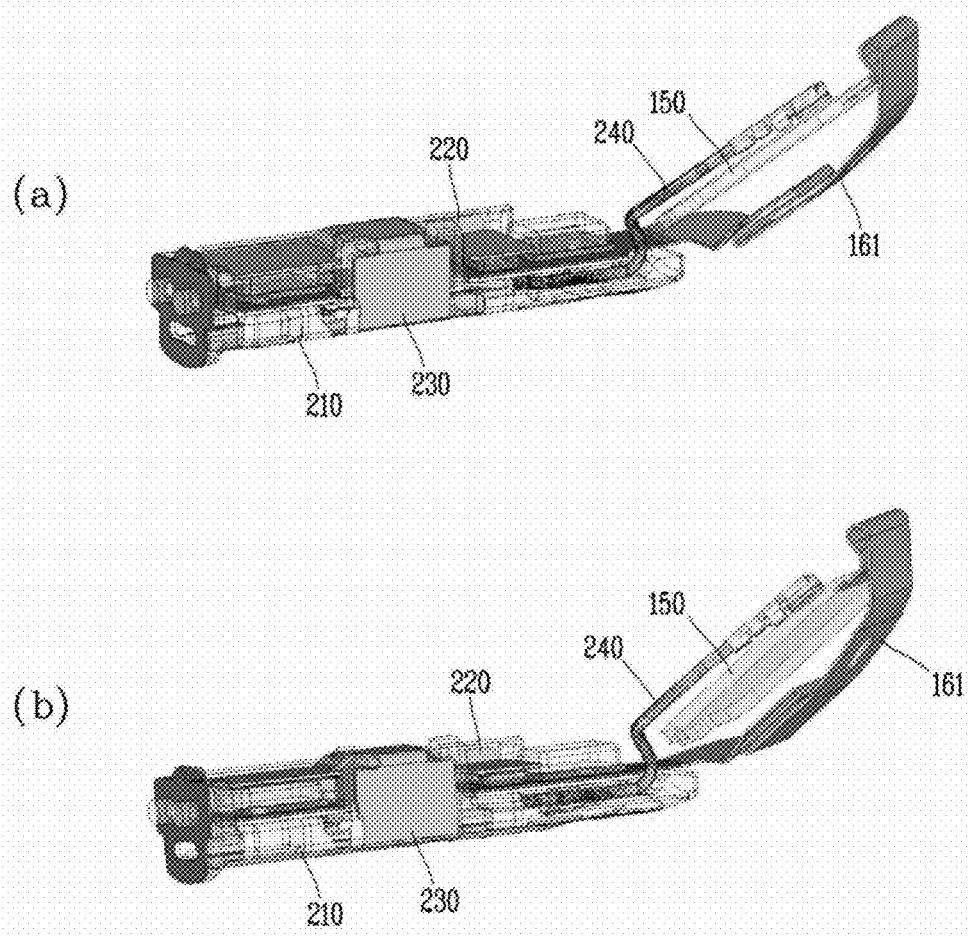

FIG. 14A shows an interface structure in which the FPCB 161 is connected through the first side area of the PCB 150. FIG. 14B shows an interface structure in which the connection FPCB 164 is connected through the second side area of the PCB 150 in the structure of FIG. 14A. FIG. 14C shows an interface structure in which the second FPCB 162 is connected through the first side area of the PCB 150 in the structure of FIG. 14B.

Referring to FIGS. 4A, 4B, 7, 10A, and 14A, a phenomenon in which radiation energy is trapped in the space between the PCB 150 and the FPCB 161 may occur. In order to prevent such trapping, the gasket 163 may be fully inserted to connect the ground structure to stabilize the ground. In this regard, the metal gasket may be formed in a rectangular parallelepiped shape. The size of the metal gasket 163 may be 1.68×1.68×2.76 mm, but the present disclosure is not limited thereto.

Referring to FIGS. 4A, 4B, 7, and 10A to 14B, the connection FPCB 164 having a connector formed at an end thereof may be connected to the FPCB 161. The connector of the connection FPCB 164 may be connected to the FPCB 161 to deliver control signals of the battery power source, the speaker, the proximity sensor 121a, and the VPU 121b. The FPCB 161 may be combined with the battery power source, the speaker, the proximity sensor 121a, and the VPU 121b through the connection FPCB 164. Thus, the FPCB 161 may be connected to the battery power source, the speaker, the proximity sensor 121a, and the VPU 121b to deliver the control signals between the FPCB 161 and the connection FPCB 164.

Referring to FIGS. 4A, 4B, 7, and 10A to 14C, the battery, the speaker, the proximity sensor 121a, and the VPU 121b may be disposed on the second FPCB 162. The FPCB 162 may be referred to as an audio FPCB because the speaker is disposed on the second FPCB 162 to output an audio signal. In order to form the ground structure between the FPCB 161 and the FPCB 162, the metal gasket 163 may be disposed between the FPCB 161 and the second FPCB 162. In other words, the FPCB 161 and the second FPCB 162 may be connected through the metal gasket 163 in order to stably form a ground current formed in the ground.

The audio FPCB may be referred to as the second FPCB 162. The battery power source, the audio module including the speaker, the proximity sensor, and the VPU units to which VPU control signals are to be delivered may be disposed on the second FPCB 162. Meanwhile, the ground pattern in addition to the signal pattern may be formed on the second FPCB 162 to form a stable ground current. The ground pattern of the second FPCB 162 may be combined with the ground pattern of the first FPCB 161 through the metal gasket 163.

Meanwhile, the mainboard PCB 150 may be implemented in the form of an FPCB. In this regard, the mainboard PCB 160 configured to control the touch sensor and the force sensor may be referred to as the sensor FPCB 150 or the third FPCB 150 when the mainboard PCB 160 is implemented as an FPCB. Thus, a plurality of FPCBs disposed inside the earbud may include the first FPCB 161 and the second FPCB 162. When the mainboard PCB 150 is implemented as FPCBs, the plurality of FPCBs may be configured to include the first FPCB 161, the second FPCB 162, and the third FPCB 150. Meanwhile, the plurality of FPCBs may be configured to include the first FPCB 161, the second FPCB 162, and the fourth FPCB 164, which is a connection FPCB. Also, the plurality of FPCBs may be configured to include all of the first FPCB 161, the second FPCB 162, the third FPCB 150, and the fourth FPCB 164.

Meanwhile, an FPCB may be disposed to surround the metal frame inside the earbud according to the present disclosure. In this regard, FIGS. 15A to 15C illustrate a structure in which an FPCB is disposed to surround the metal frame inside the earbud according to the present disclosure when the structure is viewed from different perspectives.

Figure 15A:
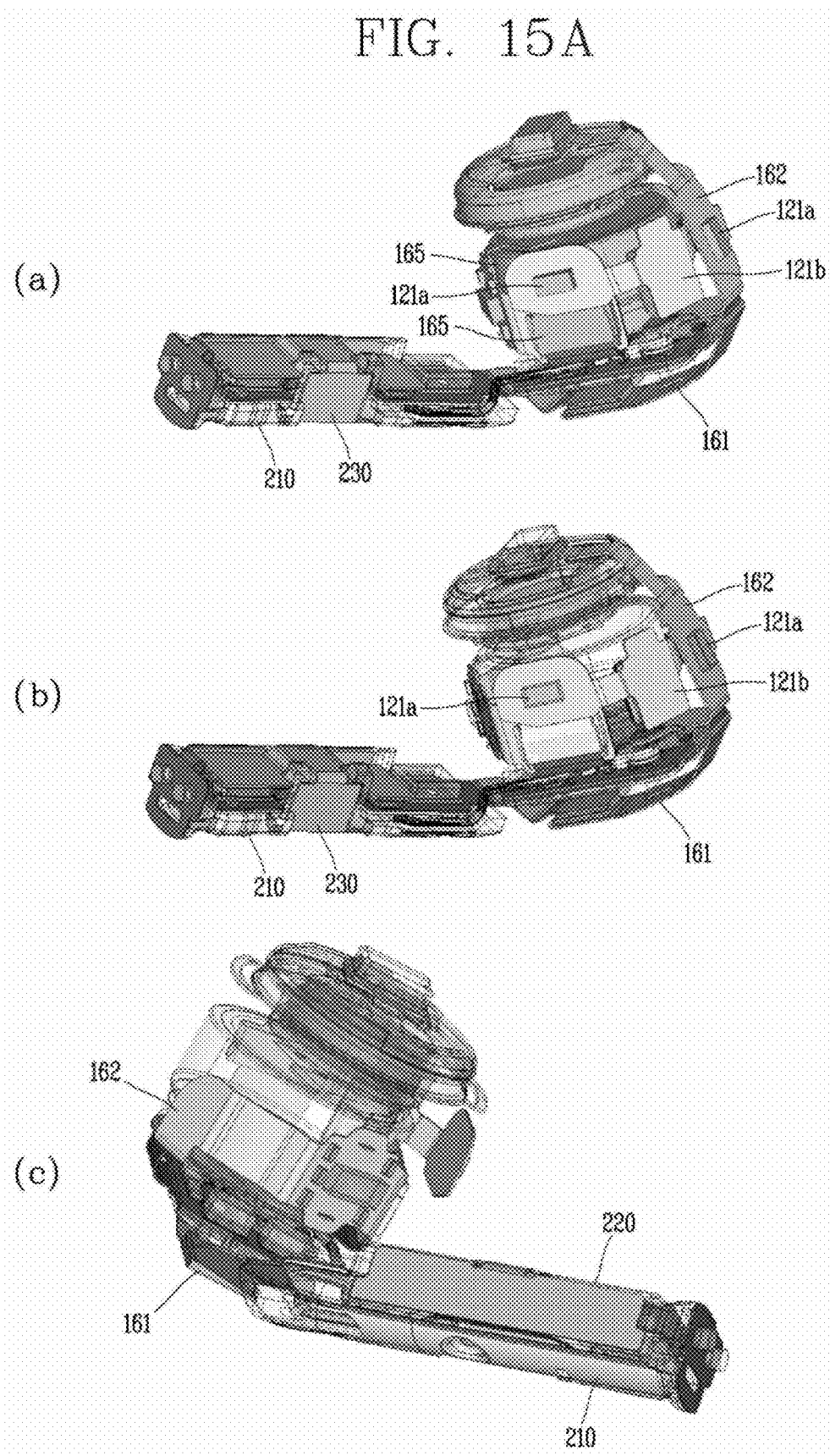
FIGS. 15A to 15C illustrate a structure in which an FPCB is disposed to surround a metal frame inside the earbud according to the present disclosure when the structure is viewed from different perspectives.
Figure 15B:
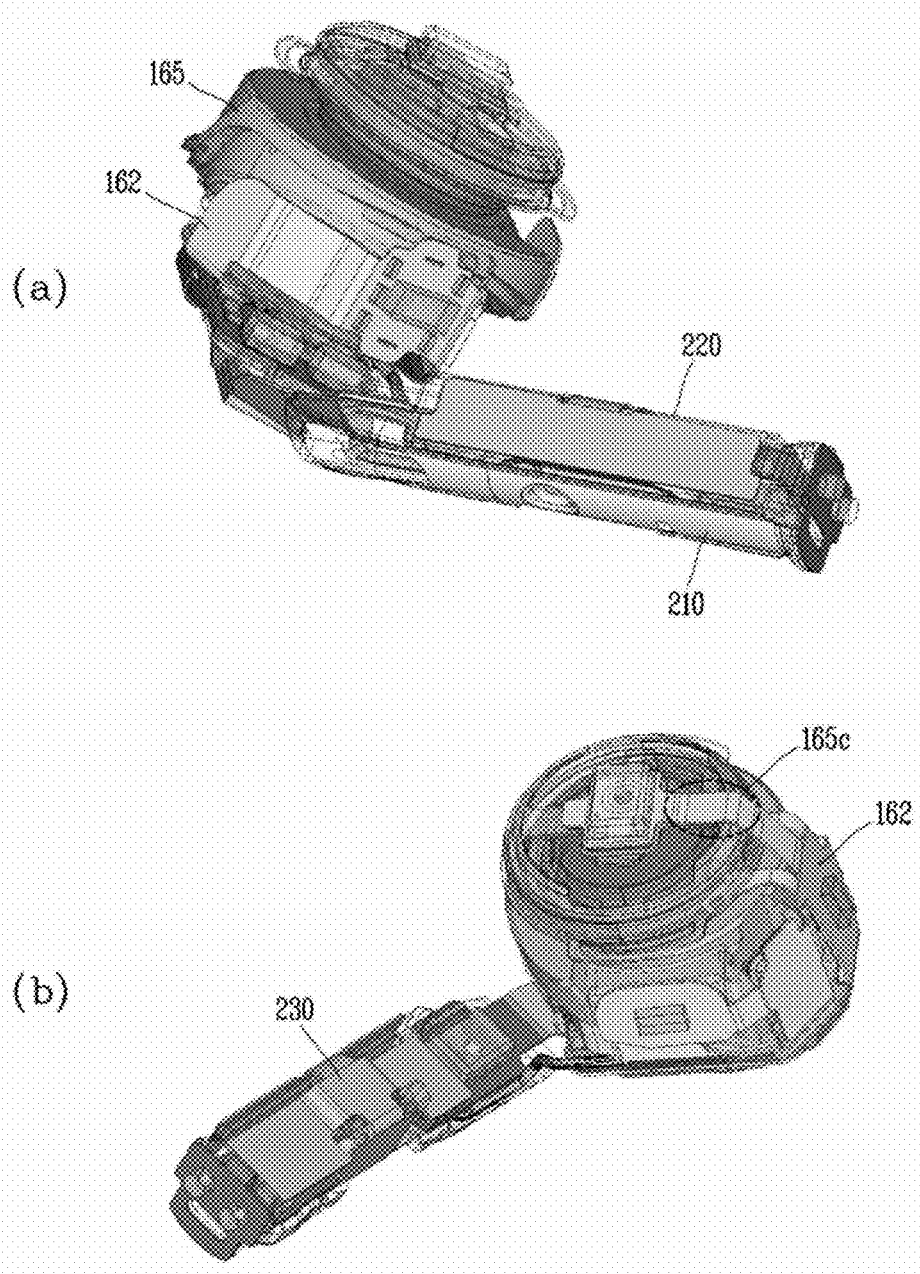
Figure 15C:
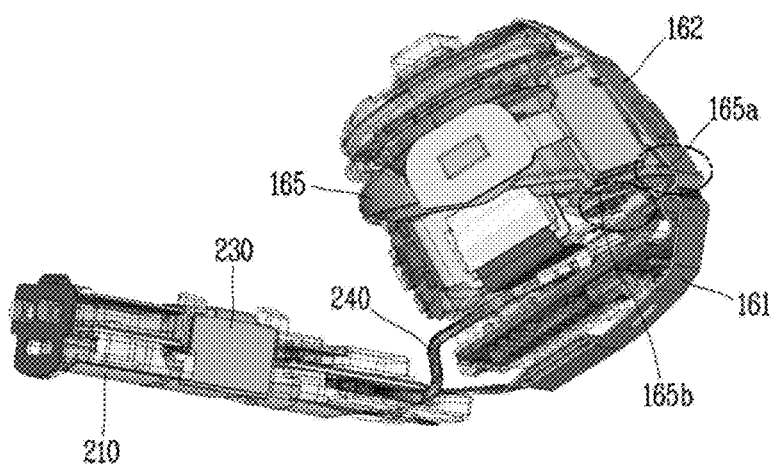

Referring to FIGS. 4A, 4B, 7, and 15A, the sensor 121a, the speaker, the microphone, and the VPU 121b may be attached to the second FPCB 162 corresponding to the audio FPCB. In this regard, the speaker frame and the second FPCB 162 may be connected for the attachment of electronic components and the stabilization of the ground structure. The second FPCB and the metal frame 165 corresponding to the speaker frame may be connected through a double-sided conductive tape to interconnect the grounds, as shown in FIG. 15A(a).

Referring to FIGS. 4A, 4B, 7, and 15B, the metal frame 165 may be placed inside the earbud. In this regard, the second FPCB 162 may be disposed in the metal frame 165. The second FPCB 162 may be formed to surround the side area of the metal frame 165. Also, the second FPCB 162 may be extended to be also disposed on the front area of the metal frame 165. In the front area of the metal frame 165, the second FPCB 162 may be attached to the metal frame 165 through a double-sided conductive tape 165*c*.

Referring to FIGS. 4A, 4B, 7, and 15C, a direct connection between the ground structures is possible through a direct connection between the metal frame 165 and the second FPCB 162 corresponding to the audio FPCB. Ground stabilization is possible through a direct connection between the metal frame 165 and the ground structure of the second FPCB 162. To this end, the ground areas of the metal frame 165 and the second FPCB 162 may be connected through the double-sided conductive tapes 165*a* and 165*b*, but the present disclosure is not limited thereto. The double-sided conductive tapes 165*a* and 165*b* may attach the metal frame 165 and the second FPCB 162 at one point of a side area and one point of a lower area of the metal frame 165.

The broadband antenna structure and mechanism and the engagement structure inside the earbud according to the present disclosure have been described above. Changes in antenna characteristics according to the presence or absence of an RF cable connection point and a slide touch sensor in the broadband antenna structure inside the earbud according to the present disclosure will be described below.

Figure 16B:
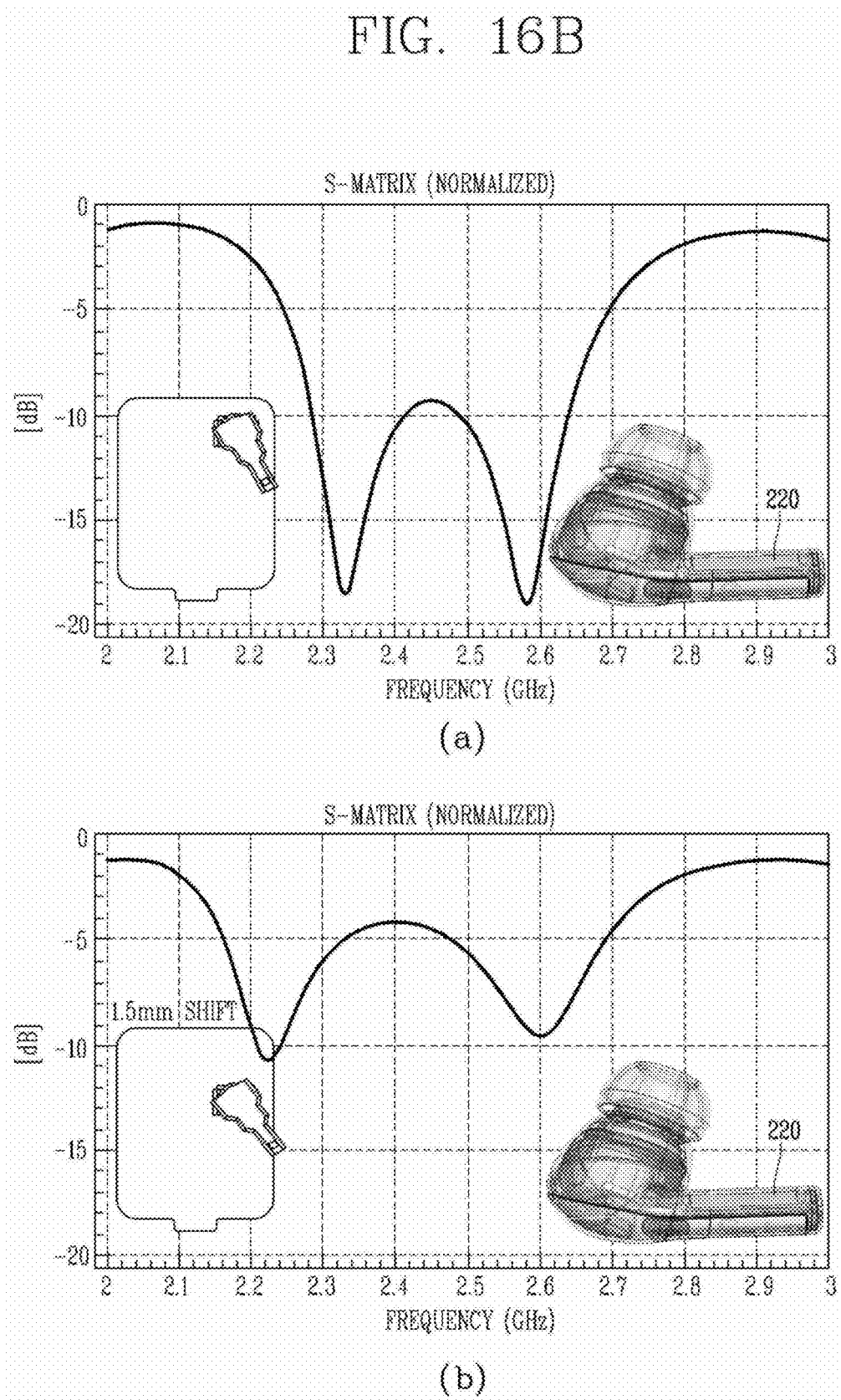
FIG. 16B illustrates reflection coefficient characteristics according to the change of an RF cable connection point when a slide touch sensor is disposed inside the earbud.

In this regard, FIG. 16A illustrates reflection coefficient characteristics according to the change of an RF cable connection point when the slide touch sensor corresponding to the coupling conductive pattern is not disposed inside the earbud. FIG. 16B illustrates reflection coefficient characteristics according to the change of an RF cable connection point when a slide touch sensor is disposed inside the earbud.

Referring to FIGS. 4A, 4B, and 16A, when no slide touch sensor is present, the second frequency band of the antenna is shifted to about 2.75 GHz, which is higher than 2.55 GHz. Also, when no slide touch sensor is present, the first frequency band of the antenna may be shifted to a frequency band lower than 2.3 GHz. Accordingly, when no slide touch sensor is present, the antenna radiation performance in the band between the first and second frequency bands is degraded even if the antenna structure operates as a radiator in the first frequency band and the second frequency band. Meanwhile, when the position of the end of the RF cable 240 is moved inward by 1.5 mm (FIG. 16A(b)), the first frequency band is moved to a lower frequency band.

Referring to FIGS. 4A, 4B, and 16B, when a slide touch sensor is provided, the second frequency band of the antenna is shifted to about 2.55 GHz. Also, when a slide touch sensor is provided, the first frequency band of the antenna is shifted to about 2.3 GHz, which is a higher frequency band. Thus, when the slide touch sensor is provided, the antenna structure operates as a radiator across the first frequency band and the second frequency band. Meanwhile, when the position of the end of the RF cable 240 is moved inward by 1.5 mm (FIG. 16B(b)), the first frequency band is moved to a lower frequency band. Accordingly, a position at which the RF cable 240 is connected to the PCB 150 being formed adjacent to an outer end of the PCB 150 may be advantageous for antenna operation and sensitivity reduction. In this regard, when the slide sensor is provided and the RF cable 240 is formed adjacent to the end, the reflection coefficient performance may be maintained below −10 dB across the first and second frequency bands.

Accordingly, the influence of the mobile switch position of the mainboard PCB 150 may correspond to the interval between the first resonance and the second resonance and the shift of the resonance frequency to a lower frequency.

Due to the occurrence of an open slot mode caused by the slide sensor, electric field orthogonality of the first resonance and the second resonance is achieved. Thus, it is possible to secure dual-resonance broadband characteristics by forming a current distribution that allows operating as a radiator across the first and second frequency bands and combining the modes.

Figure 17B:
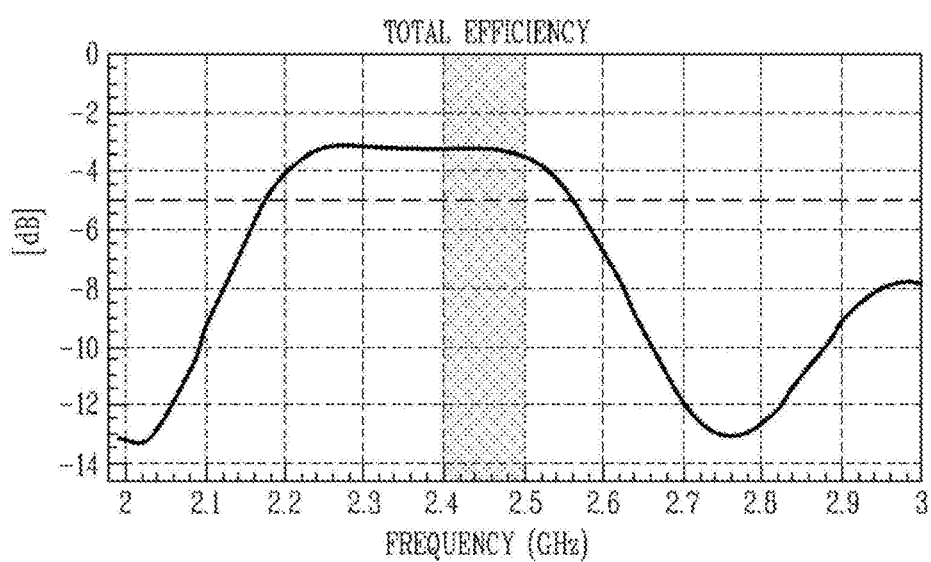
FIG. 17B shows the overall wireless performance of a broadband antenna structure disposed inside the earbud according to the present disclosure.

Meanwhile, the broadband antenna structure disposed inside the earbud according to the present disclosure should satisfy the antenna performance in a specific frequency band and the structural radiation performance of a different mechanism structure. In this regard, FIG. 17A shows the antenna performance and the structural radiation performance caused by the mechanism structure in the broadband antenna structure disposed inside the earbud according to the present disclosure. Meanwhile, FIG. 17B shows the overall wireless performance of the broadband antenna structure disposed inside the earbud according to the present disclosure.

Referring to FIGS. 4A, 4B, and 17A(a), the structural radiation performance caused by the metal frame 165 and the plurality of FPCBs 161, 162, and 164 has a high efficiency of −4 dB or more in the Bluetooth operating band. In this regard, the degradation of the structural radiation performance may be caused by the metal frame 165 and the plurality of FPCBs 161, 162, and 164. Referring to FIGS. 4A, 4B, and 17A(b), the antenna structure resonates in the first frequency band by the first conductive pattern 210 and the RF cable 240 and in the second frequency band by the first conductive pattern 210 and the second conductive pattern 220. Accordingly, the dual-mode antenna structure may operate as an antenna in a band other than the Bluetooth operating band.

The earbud having the dual-mode antenna structure may be combined with a peripheral configuration such that the structural and functional stability of the antenna is maintained. As shown in FIGS. 4A and 4B, the FPCBs 161, 162, and 164 disposed inside the earbud may be implemented to surround the gap between the metal frame 165 and the battery, not in a standardized form. Accordingly, internal components such as the VPU 121*b*, the proximity sensor 121*a*, the connector 121*c*, and the battery protection circuit 121*d* of FIG. 10*b* may be combined and supported at specific positions by the FPCBs 161, 162, and 164 disposed to surround the metal frame 165.

The FPCBs 161, 162, and 164 may have a variable shape, and the wireless performance may not be constant due to a change in spacing from surrounding components. In this regard, the radiation energy trap phenomenon may occur in the space between the FPCBs 161, 162, and 164 and the battery, the metal frame 165, and the PCB 150. Meanwhile, the FPCBs 161, 162, and 164 have a change in the energy trap phenomenon according to a change in shape, and thus the antenna resonance frequency may also be changed. In order to minimize the change in the antenna resonance frequency, a conductive tape and a gasket 164 may be disposed at appropriate positions where the FPCBs 161, 162, and 164 are combined with each other or the metal frame 165. By utilizing the conductive tape and the gasket 164, it is possible to minimize the change in wireless performance due to the deformation of the FPCBs 161, 162, and 164.

Referring to FIGS. 4A, 4B, and 17B, the overall wireless performance efficiency considering both the structural radiation performance and the antenna performance has a reference value or more in the Bluetooth operating band and the entire frequency band including the same, that is, the first and second frequency bands. In this regard, the overall wireless performance efficiency has a value of −5 dB or more in the overall frequency band including 2.3 GHz to 2.55 GHz. Accordingly, it is possible to stably receive radio signals through the earbud even if performance deviation occurs due to the use of the earbud and the manufacturing errors of the antenna and mechanism.

In summary, in order to compensate for the frequency band-specific deviation of the structural radiation efficiency characteristics as shown in FIG. 17A(a), the dual-mode radiator structure is formed as a coupling structure between the first and second conductive patterns 210 and 220. Through the open slot structure between the first and second conductive patterns 210 and 220, it is possible to compensate for wireless performance degradation due to energy trap in the FPCB structure. In this regard, as shown in FIG. 17A(b), the antenna efficiency may be maintained at a constant value in a broad band such as the 2.3 to 2.6 GHz band including the Bluetooth band. Accordingly, as shown in FIG. 17B, the overall efficiency according to the antenna structure and the overall mechanism structure in the Bluetooth band may be maintained at a constant value. Also, the overall efficiency in the broad band such as the 2.3 to 2.55 GHz band including the Bluetooth band may be maintained above a certain level (e.g., −5 dB).

The broadband antenna structure disposed inside the earbud according to the present disclosure uses a conductive pattern of a sensor and a mechanical structure such as a metal frame as a part of the radiator in addition to the conductive pattern as the radiator. Therefore, the broadband antenna structure disposed inside the earbud corresponds to a broadband sensor fusion zero-volume antenna, which has secured antenna performance in the Bluetooth band and even lower and higher bands.

The multi-mode antenna structure disposed inside the earbud may secure a broadband antenna performance, for example, an antenna bandwidth five times wider than the Bluetooth bandwidth, thereby maintaining stable antenna performance under various user scenario conditions. In this regard, the structural radiation performance according to the structures of the mechanism and the PCB may be implemented to have high radiation efficiency of at least −6 dB and an average of −5 dB in the entire band.

The earbud having the broadband antenna structure according to the present disclosure has been described above. An electronic device having an antenna inside a dielectric housing according to the present disclosure will be described below. In this regard, the electronic device having the antenna inside the dielectric housing according to the present disclosure will be described with reference to FIGS. 1 to 17B.

An electronic device 100 may include a main body portion 120b having a port 120a and a dielectric housing 120 having a protruding portion extending from the main body portion 120b. The electronic device 100 may include an antenna 200 disposed in the protruding portion and configured to radiate radio signals to the outside of the electronic device. The antenna 200 may include a first conductive pattern 210 formed on a first surface in the protrusion and a second conductive pattern 220 formed on a second surface perpendicular to the first surface. The antenna 200 may include the first conductive pattern 210 and a connection portion 240 configured to electrically connect the first conductive pattern 210 to a PCB 150. The connection portion 240 may be implemented as an RF cable, but the present disclosure is not limited thereto.

The first conductive pattern 210 and the connection portion 240 may be configured to radiate signals in a first frequency band. The first conductive pattern 210 and the second conductive pattern 220 may be configured to radiate signals in a second frequency band different from the first frequency band.

The electronic device 100 may further include the PCB 150, which is electrically connected to the antenna 200. The PCB 150 may correspond to a mainboard PCB that controls various electronic components of the earbud. The connection portion 240 may be configured as a coaxial cable including a signal line 241 formed inside, a dielectric 242 formed to surround the signal line 241, and a ground 243 formed outside to surround the dielectric 242. The signal line of the coaxial cable may be connected to the first conductive pattern 210, and the ground of the coaxial cable may be connected to the ground of the PCB 150. The first conductive pattern 210 and the ground of the coaxial cable 240 connected to the first conductive pattern 210 and disposed horizontally may radiate a first signal in the first frequency band to operate as a radiator.

The second conductive pattern 220 may be configured to include a touch sensor. The first conductive pattern 210 may be formed to a first length L1 in a first axial direction of the stoke 122, and the second conductive pattern 220 may be formed to a second length L2 in the first axial direction. The first length L1 of the first conductive pattern 210 may be formed as a length in a predetermined range from 14.6 mm. The second length L2 of the second conductive pattern 220 may be formed as a length in a predetermined range from 13.6 mm. The first frequency band may be a frequency band with a center frequency of 2.3 GHz to perform Bluetooth communication with an electronic device, and the first frequency band may be a frequency band with a center frequency of 2.6 GHz to perform the Bluetooth communication.

The first conductive pattern 210 formed on the first surface and the coaxial cable 240 formed on the first surface may be configured to radiate a first signal in the first frequency band. The first conductive pattern 210 and the second conductive pattern 220 formed on the second surface perpendicular to the first surface may be configured to radiate a second signal in the second frequency band.

The wireless earbud with the broadband antenna has been described above. The technical features and structural features of the wireless earbud having the broadband antenna may be summarized as follows, but the present disclosure is not limited thereto.

In this regard, the wireless earbud may be referred to as a true wireless stereo (TWS). In the case of TWS such as wireless earbuds, the wireless performance of the initial product may be greatly degraded due to process issues. Also, TWS has more room for wireless performance degradation depending on the characteristics of the product being dropped or moved frequently during use than other products. Therefore, an antenna disposed inside the wireless earbud needs to be designed to have an operating bandwidth as wide as possible compared to the minimum bandwidth required for Bluetooth (BT) wireless communication. The wireless earbud having an antenna structure designed to have a wide operating bandwidth compared to the minimum bandwidth may operate robustly against the above-described issues.

A broadband antenna structure having a connection structure configured to be connected to a coupling conductive pattern and a main conductive pattern according to the present disclosure is presented. The broadband antenna structure according to the present disclosure is designed to have a bandwidth of about 0.4 to 0.5 GHz, which is four or five times wider than a bandwidth of about 80 MHz or about 0.1 GHz. Accordingly, the broadband antenna structure according to the present disclosure may operate robustly against the above-described issues.

As described above, the broadband antenna structure according to the present disclosure has a wide operating bandwidth, and thus it is possible to improve the reliability of the wireless performance of TWS products adopting the broadband antenna structure. Also, LDS-based antenna process technology can be introduced through differentiated process technology in order to secure high wireless performance and reliability by applying the broadband antenna structure to TWS products. Also, an integrated functional antenna module based on sensor fusion may be provided through a coupling structure and a conductive pattern in which a sensor module is disposed compared to the existing antenna structure. Also, TWS products adopting the broadband antenna structure according to the present description can secure improved wireless performance so as to have the highest wireless communication reliability compared to all TWS product groups.

Meanwhile, the structural and technical characteristics of the dual-mode antenna structure and the mechanism structure formed inside the earbud according to the present disclosure can be formed using an optimal antenna structure and mechanism combination structure to overcome the following problems.

1) Compared to general wireless devices, earbuds are formed in a structure that facilitates trapping radiation energy. Therefore, in the radiation structure in which the antenna is formed, a null frequency band may be generated at least two to three points or more. In this regard, depending on a combination structure between the FPCB and the battery, between the FPCB and the metal frame, and between the mainboard PCB and the battery, wireless performance degradation may occur due to energy trap.

2) Compared to general wireless devices, the assembly deviation of earbuds can directly affect antenna matching performance and structural radiation performance. Accordingly, by implementing the dual-mode broadband antenna according to the present disclosure, it is possible to minimize the degradation of antenna matching performance due to the assembly deviation.

3) A design that minimizes structural radiation performance due to the assembly deviation can be obtained by securing an open slot area of the PCB and securing electrical connection reliability through stable contact between multiple members.

3) Why a metal frame was not used in electronic devices such as earbuds is that the metal frame greatly affects the structural radiation performance. An antenna structure capable of implementing a broad band while maintaining antenna performance in spite of adopting a metal frame mechanism structure is required in order to overcome the degradation of the structural radiation performance due to the metal frame. To this end, the combination structure between the FPCB and the metal frame and the radiator structure of the coupling combination structure according to the present disclosure are very important factors.

Meanwhile, the technical effects of the wireless earbud having the broadband antenna may be summarized as follows, but the present disclosure is not limited thereto.

According to the present disclosure, it is possible to allow a broadband antenna in an electronic device such as a wireless earbud to perform broadband operation.

According to the present disclosure, by allowing electric current formed in a conductive pattern of an antenna provided in a wireless earbud to be coupled to a touch sensor, it is possible to increase the operational bandwidth of the antenna.

According to the present disclosure, it is possible to receive radio signals stably even when an antenna resonance frequency is changed according to the movement of a wireless earbud in an internal ear space or the movement of a human body when the wireless earbud is worn.

According to the present disclosure, it is possible to minimize a change in antenna performance due to a narrow antenna arrangement space inside the mechanism of a wireless earbud, and thus it is possible to stably maintain wireless communication performance.

Further scope of applicability of the present disclosure will become apparent from the following detailed description. It should be understood, however, that the detailed description and specific examples, such as the preferred embodiment of the invention, are given by way of illustration only, since various changes and modifications within the spirit and scope of the invention will be apparent to those skilled in the art.

Further scope of applicability of the present disclosure will become apparent from the following detailed description. It should be understood, however, that the detailed description and specific examples, such as the preferred implementation of the invention, are given by way of illustration only, since various changes and modifications within the spirit and scope of the invention will be apparent to those skilled in the art.

In relation to the present disclosure described above, an antenna structure disposed in wireless earbuds and a control operation therefor may be implemented by software, firmware, or a combination thereof. The antenna structure disposed in the wireless earbuds and the configuration for performing the control operation therefor can be implemented as computer-readable codes in a medium in which a program is recorded. The computer-readable medium may include all types of recording devices each storing data readable by a computer system. Examples of such computer-readable media may include hard disk drive (HDD), solid state disk (SSD), silicon disk drive (SDD), ROM, RAM, CD-ROM, magnetic tape, floppy disk, optical data storage element and the like. Also, the computer-readable medium may also be implemented as a format of carrier wave (e.g., transmission via an Internet). In addition, the computer may include a control unit (or controller) of the terminal or wireless earbuds, that is, a processor. Therefore, the detailed description should not be limitedly construed in all of the aspects, and should be understood to be illustrative. Therefore, all changes and modifications that fall within the metes and bounds of the claims, or equivalents of such metes and bounds are therefore intended to be embraced by the appended claims.

What is claimed is:

1. An earbud comprising:
a housing having a main body portion having a speaker port and a stoke extending from the main body portion;
a radiator disposed in the stoke and configured to radiate radio signals to outside the earbud; and
a printed circuit board (PCB) configured to be electrically connected to the radiator,
wherein:
the radiator comprises:
a first conductive pattern located on a first surface in the stoke;
a second conductive pattern located on a second surface perpendicular to the first surface; and a connection portion configured to electrically connect the PCB to the first conductive pattern;

the first conductive pattern and the connection portion are configured to radiate signals in a first frequency band; and the first conductive pattern and the second conductive pattern are configured to radiate signals within a second frequency band different from the first frequency band.

2. The earbud of claim 1, wherein:

the connection portion comprises a coaxial cable including a signal line located therein, a dielectric surrounding the signal line, and a ground surrounding the dielectric;

the signal line of the coaxial cable is connected to the first conductive pattern;

the ground of the coaxial cable is connected to a ground of the PCB; and the first conductive pattern and the ground of the coaxial cable, which is connected to the first conductive pattern, radiate a first signal in the first frequency band to operate as the radiator.

3. The earbud of claim 2, wherein:

the second conductive pattern comprises a touch sensor; and the first conductive pattern has a length along an axial direction of the stoke, and the second conductive pattern has a length along the axial direction.

4. The earbud of claim 3, wherein:

the length of the first conductive pattern is in a predetermined range with respect to about 14.6 mm, and the length of the second conductive pattern is in a predetermined range with respect to about 13.6 mm; and the first frequency band is a frequency band having a center frequency of 2.3 GHz for performing Bluetooth communication with an electronic device, and the second frequency band is a frequency band having a center frequency of 2.6 GHz for performing the Bluetooth communication.

5. The earbud of claim 3, wherein:

the first conductive pattern and the coaxial cable are configured to radiate a first signal in the first frequency band;

the first conductive pattern and the second conductive pattern are configured to radiate a second signal in the second frequency band; and a direction of a first electric current generated by the coaxial cable and the first conductive pattern and a direction of a second electric current generated by the second conductive pattern are orthogonal to each other so that the radiator performs broadband operation in the first frequency band and the second frequency band.

6. The earbud of claim 2, wherein:

the radiator further comprises a third conductive pattern located on a third surface facing the second conductive pattern; and the third conductive pattern comprises a force sensor.

7. The earbud of claim 6, wherein:

the third conductive pattern is configured to radiate a signal in a third frequency band higher in frequency than the second frequency band; and the third frequency band is a 5 GHz band or a 7 GHz band for Bluetooth communication.

8. The earbud of claim 6, wherein:

a signal pattern of the third conductive pattern comprises a conductive pattern of a predetermined shape to operate as a force sensor; and a ground pattern of the third conductive pattern is electrically connected to the ground of the coaxial cable.

9. The earbud of claim 2, wherein:

a signal pattern of the first conductive pattern comprises a conductive pattern of a predetermined shape to radiate signals in the first frequency band and the second frequency band; and a ground pattern of the first conductive pattern is electrically connected to the ground of the coaxial cable.

10. The earbud of claim 2, wherein:

a signal pattern of the second conductive pattern comprises a conductive pattern of a predetermined shape to radiate signals in the second frequency band and to operate as a touch sensor; and a ground pattern of the second conductive pattern is electrically connected to the ground of the coaxial cable.

11. The earbud of claim 1, wherein an end portion of the first conductive pattern and an end portion of the second conductive pattern are separated from each other, and an electric current generated by the first conductive pattern is distributed to the second conductive pattern in the second frequency band.

12. The earbud of claim 1, further comprising a flexible printed circuit board (FPCB) configured to connect the PCB and the first conductive pattern, wherein the FPCB surrounds a metal frame forming an inner side area formed as a curved surface of the main body portion.

13. The earbud of claim 12, further comprising:

a second FPCB connected to an end of the FPCB and disposed in the inner side area; and a metal gasket configured to connect a ground pattern of the FPCB and a ground pattern of the second FPCB to the metal frame.

14. The earbud of claim 12, wherein:

the main body portion comprises a proximity sensor, a voice pickup unit (VPU) disposed in a first side area of an outer side, and a connector and a battery protection circuit disposed between an inner side and a second side area of the outer side; and the FPCB, which is disposed between the main body portion and the metal frame, is electrically connected to the proximity sensor, the VPU, the connector, and the battery protection circuit.

15. The earbud of claim 1, wherein the first conductive pattern is selectively formed on a dielectric molded portion using a laser, and the second conductive pattern is formed over the first conductive pattern by plating.

16. An electronic device comprising:

a dielectric housing having a main body portion having a port and a protruding portion extending from the main body portion; and an antenna disposed in the protruding portion and configured to radiate radio signals to outside the electronic device, wherein:

the antenna comprises:

a first conductive pattern located on a first surface in the protruding portion;

a second conductive pattern located on a second surface perpendicular to the first surface; and a connection portion configured to electrically connect the first conductive pattern and a printed circuit board (PCB);

the first conductive pattern and the connection portion are configured to radiate signals in a first frequency band; and the first conductive pattern and the second conductive pattern are configured to radiate signals in a second frequency band different from the first frequency band.

17. The electronic device of claim 16, further comprising the PCB, which is electrically connected to the antenna, wherein:

the connection portion comprises a coaxial cable including a signal line located therein, a dielectric surrounding the signal line, and a ground surrounding the dielectric;

the signal line of the coaxial cable is connected to the first conductive pattern;

the ground of the coaxial cable is connected to a ground of the PCB; and the first conductive pattern and the ground of the coaxial cable, which is connected to the first conductive pattern, radiate a first signal in the first frequency band to operate as a radiator.

18. The electronic device of claim 17, wherein:

the second conductive pattern comprises a touch sensor; and the first conductive pattern has a length along an axial direction of the protruding portion, and the second conductive pattern has a length along the axial direction.

19. The electronic device of claim 18, wherein:

the length of the first conductive pattern is in a predetermined range with respect to about 14.6 mm, and the length of the second conductive pattern is in a predetermined range with respect to about 13.6 mm; and the first frequency band is a frequency band having a center frequency of 2.3 GHz for performing Bluetooth communication with the electronic device, and the second frequency band is a frequency band having a center frequency of 2.6 GHz for performing the Bluetooth communication.

20. The electronic device of claim 18, wherein:

the first conductive pattern and the coaxial cable are configured to radiate a first signal in the first frequency band; and the first conductive pattern and the second conductive pattern are configured to radiate a second signal in the second frequency band.

* * * * *